(12) United States Patent
Lilak et al.

(10) Patent No.: US 11,515,318 B2
(45) Date of Patent: Nov. 29, 2022

(54) 3D FLOATING-GATE MULTIPLE-INPUT DEVICE

(71) Applicant: Intel Corporation, Santa Clara, CA (US)

(72) Inventors: Aaron Lilak, Beaverton, OR (US); Patrick Morrow, Portland, OR (US); Sayed Hasan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 779 days.

(21) Appl. No.: 16/272,816

(22) Filed: Feb. 11, 2019

(65) Prior Publication Data

US 2020/0258894 A1 Aug. 13, 2020

(51) Int. Cl.
*H01L 27/11556* (2017.01)
*H03K 19/23* (2006.01)
*H01L 27/11519* (2017.01)

(52) U.S. Cl.
CPC .. *H01L 27/11556* (2013.01); *H01L 27/11519* (2013.01); *H03K 19/23* (2013.01)

(58) Field of Classification Search
CPC ......... H01L 27/11556; H01L 27/11519; H01L 27/11521; H01L 29/40114; H01L 29/788; H03K 19/23; G11C 16/0425
See application file for complete search history.

(56) References Cited

U.S. PATENT DOCUMENTS

| | | | |
|---|---|---|---|
| 7,514,964 B2 * | 4/2009 | Fijany | H01L 27/11807 377/64 |
| 10,014,318 B2 * | 7/2018 | Or-Bach | H01L 29/7827 |

* cited by examiner

*Primary Examiner* — Allison Bernstein
(74) *Attorney, Agent, or Firm* — Schwabe, Williamson & Wyatt, P.C.

(57) ABSTRACT

A multiple input device is disclosed. The multiple input device includes a semiconductor structure extending in a first direction, a first dielectric material surrounding a portion of the semiconductor structure, a floating gate on the first dielectric material and surrounding the portion of the semiconductor structure, and a second dielectric material on the floating gate and surrounding the portion of the semiconductor structure. The multiple input device also includes a plurality of control gates on the second dielectric material. At least one of the control gates extends vertically away from the semiconductor structure in a second direction and at least one of the control gates extends vertically away from the semiconductor structure in a third direction.

20 Claims, 22 Drawing Sheets

3D FLOATING-GATE MULTIPLE-INPUT DEVICE

TECHNICAL FIELD

Embodiments of the disclosure pertain to floating-gate multiple input devices and, in particular, to 3D floating-gate multiple-input devices.

BACKGROUND

Weighted-sum devices are key enablers for artificial intelligence (AI) and machine learning. In weighted sum computing, a gate can be used to calculate an output based upon several inputs. In either a capacitive coupling or a tunneling configuration, the gate has the capability to create an output that is a function of the weighted sums of the input voltages applied. Considerable research into components that can perform weighted-sum operations is being undertaken. These efforts have heavily explored technologies such as memristive circuit elements.

Majority gates are logic gates that can be used to perform weighted sum computations. A majority gate returns true if and only if more than 50% of its inputs are true. For example, the majority gate produces "1" when more than half of the inputs of the majority gate are 1 and produces "0" when more than half the inputs of the majority gate are 0. In many applications majority gates are designed to have an odd number of inputs such that situations where exactly half the inputs are 0 and half the inputs are 1 are not encountered. Conventional majority gate weighted sum architectures are planar. The planar architectures have significant scaling and device electrostatic disadvantages due to their planar structure which limits the device density that is attainable and presents electrical interference challenges.

Figure 1:
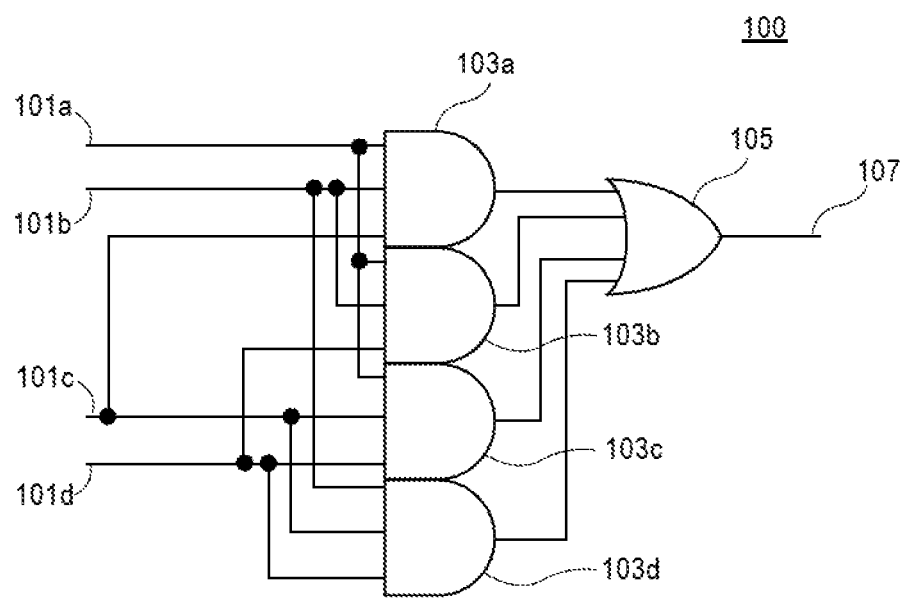
FIG. 1 is a schematic illustration of a four input majority gate implemented as a logic gate.

DESCRIPTION OF THE EMBODIMENTS 3D floating-gate multiple-input device is described. It should be appreciated that although embodiments are described herein with reference to example 3D floating-gate multiple-input device implementations, the disclosure is more generally applicable to 3D floating-gate multiple-input device implementations as well as other type 3D floating-gate multiple-input device implementations. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Weighted-sum devices are key enablers for AI and machine learning. Majority gates are logic gates that can be used to perform weighted sum computations. Conventional majority gate weighted sum architectures are planar. The planar architectures have significant scaling and device electrostatic disadvantages due to their planar structure which limits attainable device density and causes electrical interference challenges.

An approach that addresses the shortcomings of previous approaches is disclosed herein. For example, as part of a disclosed process, a three-dimensional (3D) nanowire device which can provide both majority gate operation and weighted-sum computation is provided. In an embodiment, the multiple transistor and logic equivalent units of conventional majority gate logic approaches are replaced by a single transistor which enables die scaling and cost reduction.

FIG. 1 shows a four input majority gate 100 used in a previous approach. The majority gate 100 is a logic gate that implements a majority function. The four input majority gate 100 includes inputs 101a-101d, gates 103a-103d, gate 105 and output 107.

Referring to FIG. 1, the inputs 101a-101c are inputs to gate 103a. The inputs 101a, 101b and 101d are inputs to gate 103b. The inputs 101a, 101c and 101d are inputs to gate 103c. The inputs 101b, 101c and 101d are inputs to gate 103d. The outputs of gates 103a-103d are inputs to gate 105. The gate 105 provides the output 107.

In operation, when three of the four inputs 101a-101d of the majority gate 100 are at logic 1 the output 107 is logic 1. In general, a majority gate such as the majority gate 100 returns true (logic 1) if more than fifty percent of its inputs are true. It should be appreciated that the majority gate 100 can be used in various types of circuitry.

In an embodiment, the majority gate 100 of FIG. 1 can be replaced with a single transistor. In an embodiment, in this manner weighted sum computation and n-bit logic to binary logic conversion can be provided by a single transistor as described with reference to FIG. 2.

Figure 2:
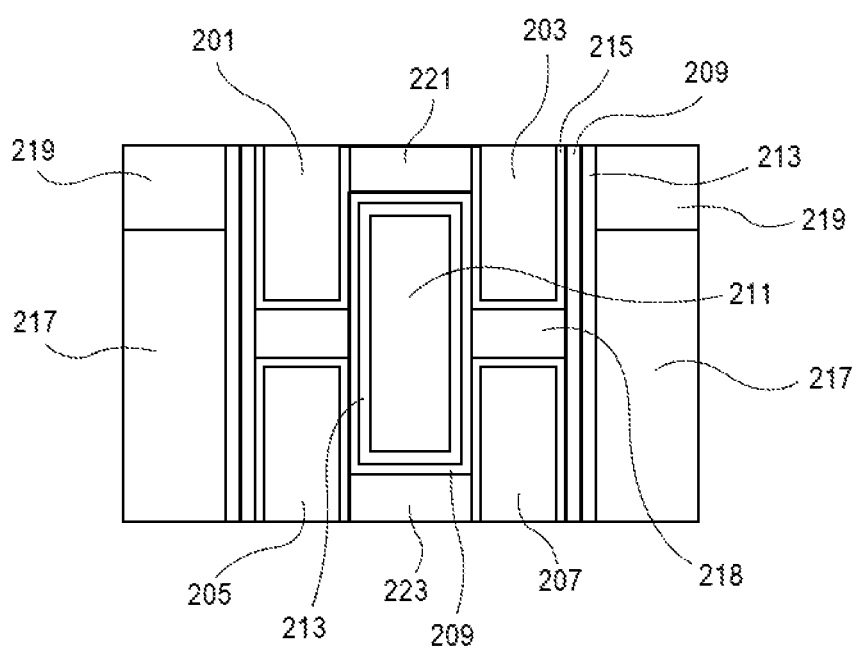
FIG. 2 is an illustration of a three-dimensional (3D) floating gate multiple-input device according to an embodiment.

FIG. 2 shows a 3D floating gate multiple-input device 200 according to an embodiment. In an embodiment, 3D floating gate multiple-input device 200 can include a single transistor that can replace a majority gate such as the majority gate 100 of FIG. 1. In the FIG. 2 embodiment, the 3D floating gate multiple-input device 200 includes gate 201, gate 203, gate 205, gate 207, floating gate 209, channel (silicon) 211, high k material 213, high k material 215, insulator 217, insulator 218, insulator 219, helmet 221 and helmet 223.

Referring to FIG. 2, the gate 201 includes a first portion that is formed adjacent an upper first side of the channel 211 and a second portion that extends vertically from the first portion above the upper surface of the channel 211. The gate 203 includes a first portion that is formed adjacent an upper second side of the channel 211 and a second portion that extends vertically from the first portion above the upper surface of the channel 211. The gate 205 includes a first portion that is formed adjacent a lower first side of the channel 211 and a second portion that extends vertically from the first portion below the lower surface of channel 211. The gate 207 includes a first portion that is formed adjacent a lower second side of the channel 211 and a second portion that extends vertically from the first portion below the lower surface of the channel 211. The floating gate 209 is formed on the high k material 213 which surrounds the channel 211 and that is formed on sidewalls formed by the insulator 217 and the insulator 219 that are spaced away from a first side and a second side of the channel 211. In an embodiment, the surface of the channel 211 is covered by the high k material 213. The high k material 215 is formed on the floating gate 209. Thus, in an embodiment, the high k material 215 surrounds the channel 211 above the part of the floating gate 209 that surrounds the channel 211 and is formed on the part of the floating gate 209 that is formed on the sidewalls formed by the insulator 217 and the insulator 219 that are spaced apart from a first side and a second side of the channel 211. The insulator 219 is formed above the insulator 217. In an embodiment, the helmet 221 is formed on the floating gate 209 above the upper part of the channel 211 and the helmet 223 is formed on the floating gate 209 below the lower part of the channel 211.

In an embodiment, the gate 201, the gate 203, the gate 205 and the gate 207 can be formed from a gate metal. In other embodiments, the gate 201, the gate 203, the gate 205 and the gate 207 can be formed from other material. In an embodiment, the floating gate 209 can be formed from polysilicon. In other embodiments, the floating gate 209 can be formed from other materials. In an embodiment, the channel (silicon) 211 can be formed from silicon. In other embodiment, the channel can be formed from other materials. In an embodiment the high k material 213 can be formed from hafnium, silicon, oxygen, titanium, tantalum, lanthanum, aluminum, zirconium, barium, strontium, yttrium, lead, scandium, niobium, and zinc. In other embodiments, the high k material 213 can be formed from other materials. In an embodiment, the high k material 215 can be formed from hafnium, silicon, oxygen, titanium, tantalum, lanthanum, aluminum, zirconium, barium, strontium, yttrium, lead, scandium, niobium, and zinc. In other embodiment, the high k material 215 can be formed from other materials. In an embodiment, the insulator 217 can be formed from nitride. In other embodiments, the insulator 217 can be formed from other materials. In an embodiment, the insulator 219 can be formed from oxide. In other embodiments, the insulator 219 can be formed from other materials. In an embodiment, the helmet 221 and the helmet 223 can be formed from Si (such as sputtered Si). In an embodiment, the helmet 221 and the helmet 223 can be formed from other materials.

In operation, the 3D floating gate multiple-input device 200 may operate through either capacitive coupling or electron tunneling and use a conductive floating gate (as in a flash memory device). In an embodiment, a metal floating gate can be used. In other embodiments, other materials can be used. In an embodiment, the 3D floating gate multiple-input device 200 can be a multi-input device used in digital logic applications and can employ a majority-gate or fractional-gate configuration. In a majority gate or fractional gate configuration the 3D floating gate multiple-input device 200 conducts when n/m of the gates are logic level 1 (where m is the total number of control gates). This behavior is determined by the area of each control gate 201, 203, 205 and 207, the doping/work-function of the floating gate 209, the gate dielectric and other factors. In a capacitive coupling embodiment, the voltage that is coupled to the floating gate 209 is a function of the voltages applied to each control gate 201, 203, 205 and 207, the capacitances between the control gates 201, 203, 205 and 207 and the floating gate 209, and the sum of the gate capacitances. In an electron tunneling embodiment, the charge on the floating gate 209 is determined by the tunneling current (as in a flash device). In an embodiment, when charge is provided to the floating gate 209, the 3D floating gate multiple-input device 200 operates as does a traditional MOSFET with the device achieving an "on" state when the voltage on the floating gate 209 exceeds the threshold voltage of the device.

In an embodiment, it should be appreciated that the voltage polarity applied to the control gates 201, 203, 205 and 207 need not be the same. For example, a $\frac{2}{4}$ths fractional gate can be transformed dynamically into a 3/3rds, $\frac{2}{3}$rds or $\frac{1}{3}$rd fractional gate by applying a negative threshold set voltage to the 4th control gate when used in a capacitive coupling configuration. In an embodiment, in such a configuration, the behavior of the gate can be dynamically controlled and reconfigured. For example, in an embodiment, the device can be configured to operate as a 2-input reconfigurable gate based on a 3-gate input. In particular, the device can be caused to function as either a NAND gate or a NOR gate with the functionality of the device dynamically changed based upon the polarity and magnitude of the voltage that is applied to the third input terminal.

In an embodiment, the 3D floating gate multiple-input device 200 can be used for weighted sum computing and neural computing. In such an embodiment, the output can be calculated based upon several inputs. In an embodiment, in either a capacitive coupling or a tunneling configuration, the 3D floating gate multiple-input device 200 has the capability to create an output that is a function of the weighted sums of the input voltages applied.

In an embodiment, the 3D floating gate multiple-input device 200 can be used as a weighted sum memory element when the device is configured to operate in a tunneling mode. In this mode, the floating gate 209 serves to store a charge (e.g., similar to NAND memory) and can function as a memory cell (where the value that is stored is the logical state of the weighted sum of the inputs). In an embodiment, the 3D floating gate multiple-input device 200 can include a lateral configuration with a nanowire like stack constructed with a semiconductor layer sandwiched between conductor layers (see FIGS. 3A-3K). In other embodiments, the 3D floating gate multiple-input device 200 can have other structures. In an embodiment, the 3D floating gate multiple-input device 200 can be used as a clock-controlled logic element in a stacked device architecture with the floating gate connected to a pass gate on a second device strata.

FIGS. 3A-3K are illustrations of cross-sections of a semiconductor structure 300 during a process for forming a 3D floating gate multiple input device according to an embodiment. In particular, FIGS. 3A-3K are illustrations of a semiconductor structure 300 during a process for forming a 3D floating gate 2-input device according to an embodiment.

Figure 3A:
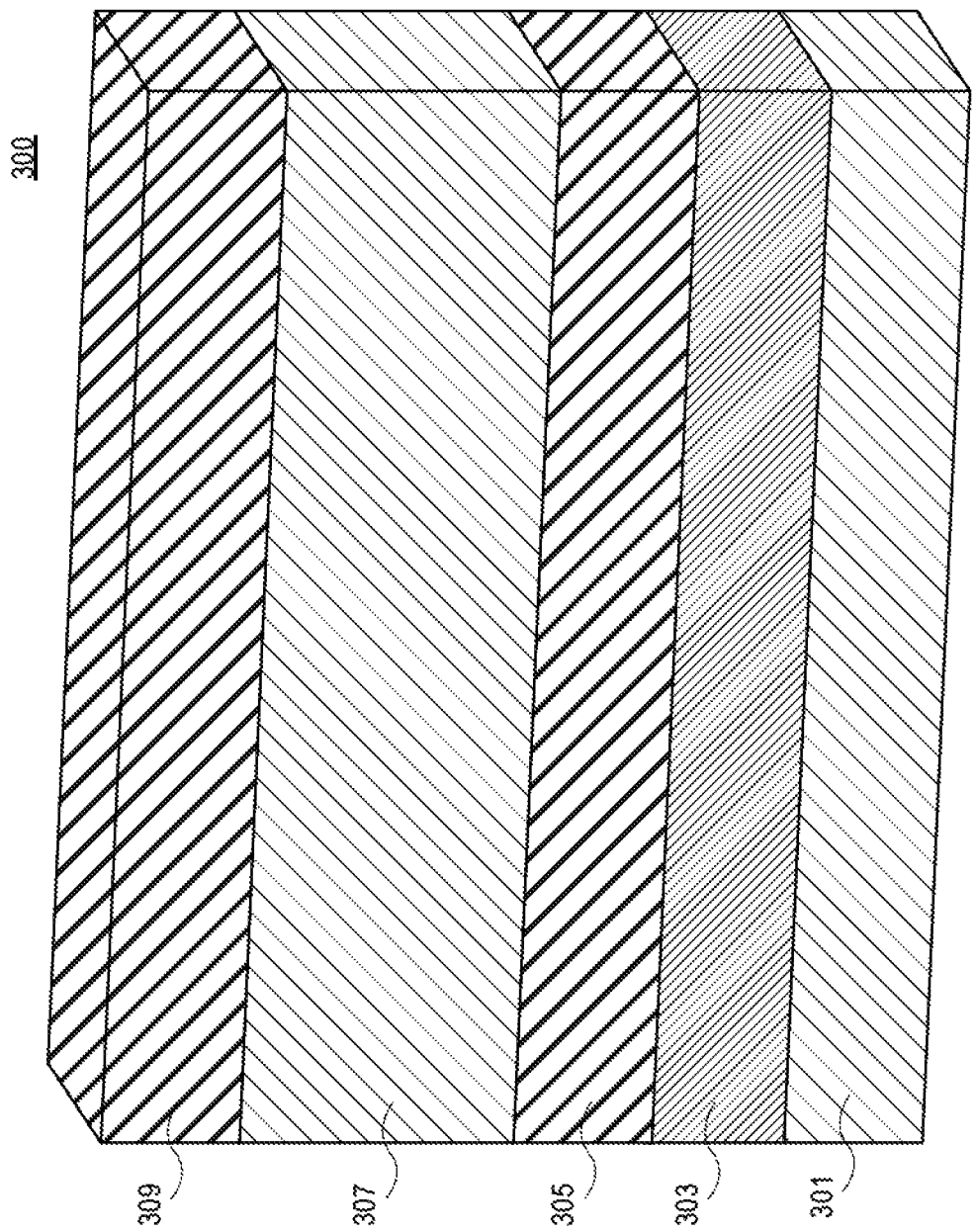
FIG. 3A-3K are illustrations of cross-sections of a semiconductor structure during a process for forming a 3D floating gate multiple input device according to an embodiment.

Referring to FIG. 3A, structure 300 includes substrate 301, insulator 303, semiconductor 305, semiconductor 307 and semiconductor 309. In an embodiment, the substrate 301 can be formed from Si. In other embodiments, the substrate can be formed from other materials. In an embodiment, the insulator layer 303 can be formed from oxide. In other embodiments, the insulator 303 can be formed from other materials. In an embodiment, the semiconductor 305, the semiconductor 307, and the semiconductor 309 are alternating layers of semiconductor materials with high etch selectivity to each other and/or to insulator region 303. In an embodiment, the semiconductor 305 can be formed from SiGe. In other embodiments, the semiconductor 305 can be formed from other materials. In an embodiment, the semiconductor 307 can be formed from a variety of materials. In an embodiment, the semiconductor 307 can be formed from silicon based materials, group IV materials, group III-V materials (e.g., InGaAs), amorphous oxide materials (e.g., IGZO), etc. In other embodiments, the semiconductor 307 can be formed from other materials. In an embodiment, the semiconductor 309 can be formed from SiGe. In other embodiments the semiconductor 309 can be formed from other materials.

In an embodiment, any number of layers can be formed. In an embodiment, the middle semiconductor layer 307 can be used to form a channel. Moreover, in an embodiment, additional layers can be added to form a multi-nanowire device. In an embodiment, the middle layer can include a Si layer that is formed between SiGe layers. In other embodiments, layers having other material compositions can be used. In an embodiment, from the structure 300 a multiple input gate device can be formed that includes left and right gate inputs or top and bottom gate inputs as described hereinbelow.

Figure 3B:
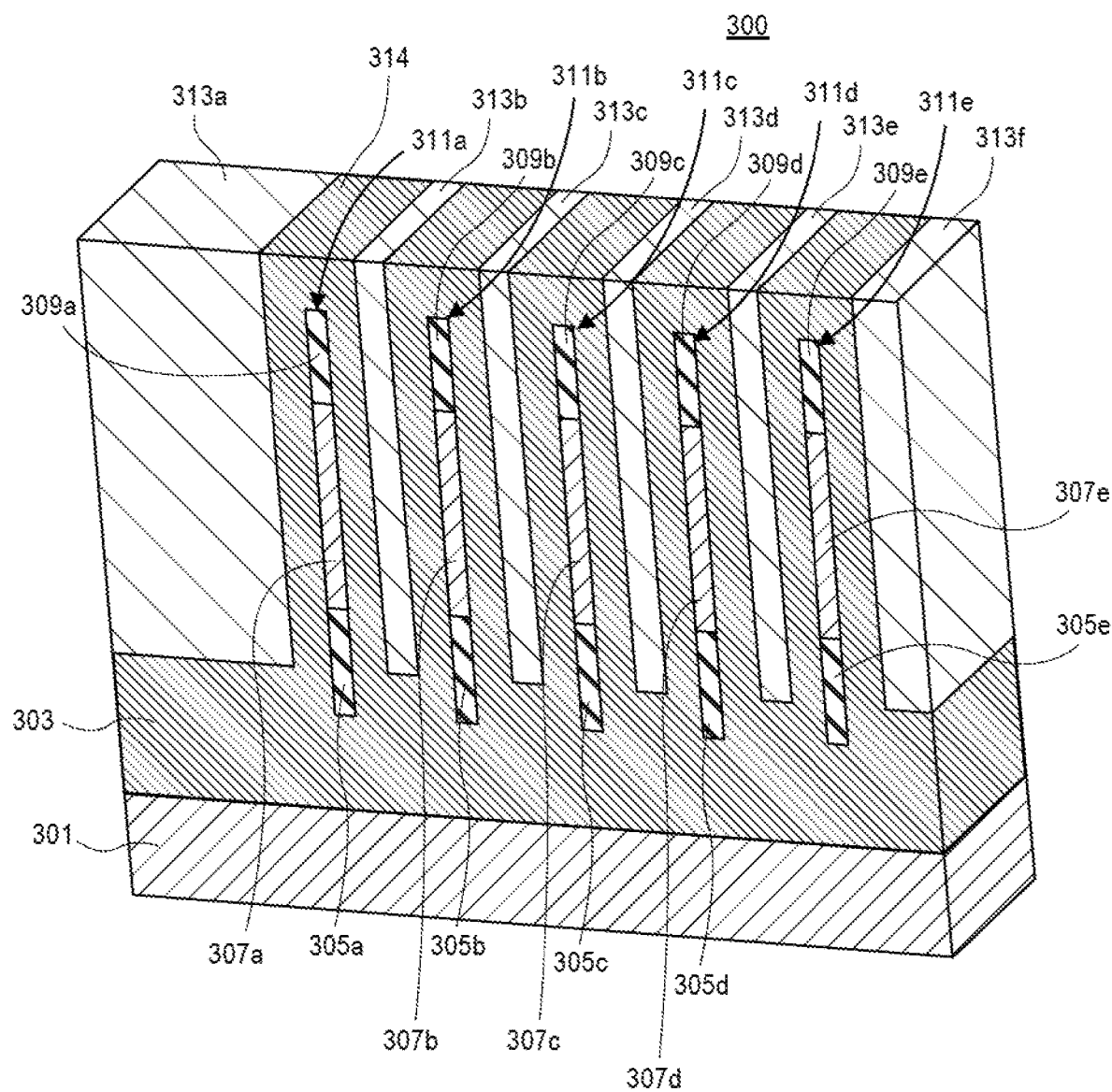

Referring to FIG. 3B, after one or more operations that result in the cross-section of the structure 300 shown in FIG. 3A, fins 311a-311e are formed in the structure 300. In some embodiments, isolation walls 313a-313f can also be formed. In the FIG. 3B embodiment, the isolation walls 313b-313e are formed between the adjacent fins 311a-311e. In addition, isolation walls 313a and 313f are formed at the ends of the structure 300 adjacent fins 311a and 311e. In other embodiments, the isolation walls 313a-313f may not be used. In an embodiment, the isolation walls 313a-313f can be formed from nitride. However, in other embodiments, the isolation walls 313a-313f can be formed from other materials or several different materials. In addition, in an embodiment, an insulator 314 can be formed between the isolation walls 313a-313f and the fins 311a-311e. In an embodiment, the insulator 314 can be formed from oxide. In other embodiments, the insulator can be formed from other materials. In an embodiment, the fins 311a-311e include semiconductor parts 305a-305e, 307a-307e and 309a-309e, respectively.

Figure 3C:
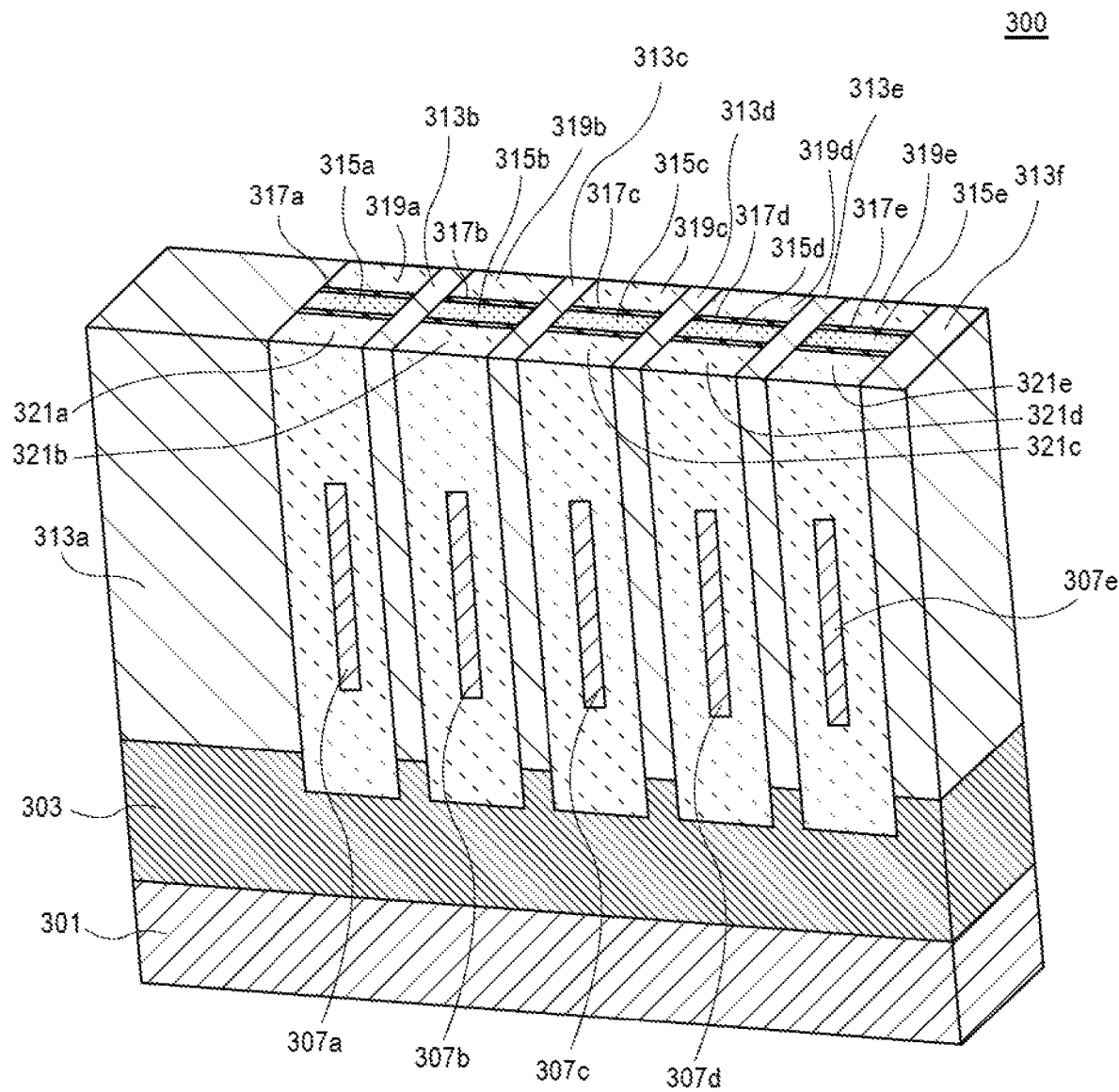

Referring to FIG. 3C, after one or more operations that result in the cross-section of the structure 300 shown in FIG. 3B, a gate is patterned. In an embodiment, the gate is patterned in the insulator 314 shown in FIG. 3B. In an embodiment, as part of the patterning of the gate, a replacement gate material 315a-315e may be inserted in a space formed in the insulator 314 to accommodate the gate for a gate-last process. In an embodiment, the replacement gate material 315a-315e can be formed from polysilicon. In other embodiments, the replacement gate material 315a-315e can be formed from other materials. In an embodiment, many different permutations of the aforementioned operations can be used. In addition, gate spacers 317a-317e can be formed on first and second sides of the space formed in the insulator to accommodate the gate. In an embodiment, the gate spacers 317a-317e can be formed from silicon oxide, silicon oxynitride or carbon doped silicon oxynitride. In other embodiments, the gate spacers 317a-317e can be formed from other materials. In an embodiment, source 319a-319e and drain 321a-321e epitaxial regions can (optionally) be formed. In an embodiment, for a PMOS device on silicon, the source 319a-319e and the drain 321a-321e epitaxial regions can be formed from SiGe doped with boron. In an embodiment, for an NMOS device on silicon, the source 319a-319e and the drain 321a-321e epitaxial regions can be formed from Si doped with phosphorous or arsenic or with phosphorous and arsenic doped silicon or germanium. In an embodiment, for a III-V channel, the source 319a-319e and the drain 321a-321e can be formed from gallium antimonide and InAs. However, in other embodiments, the source 319a-319e and the drain 321a-321e can be formed from other material.

Figure 3D:
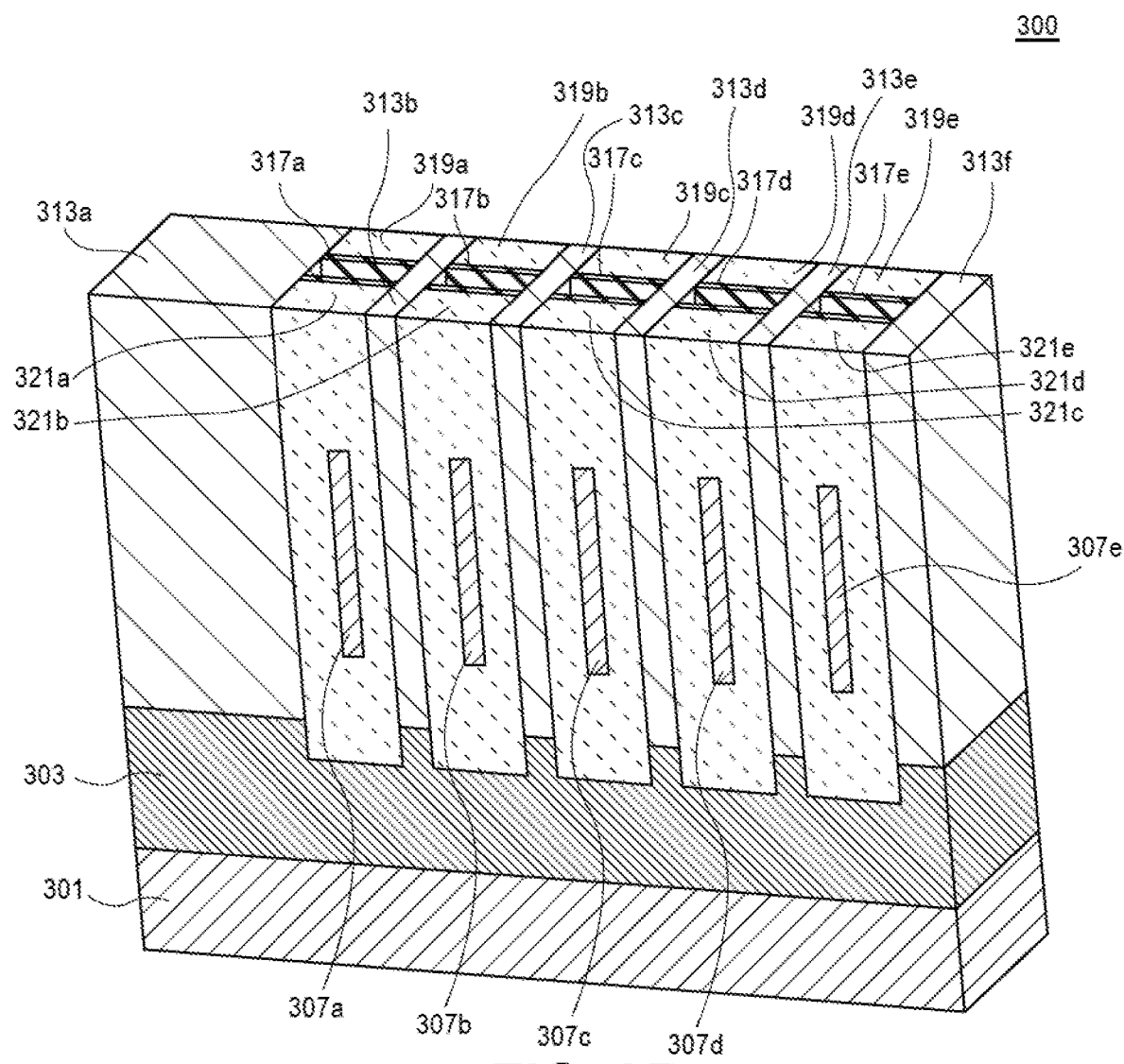
Figure 3E:
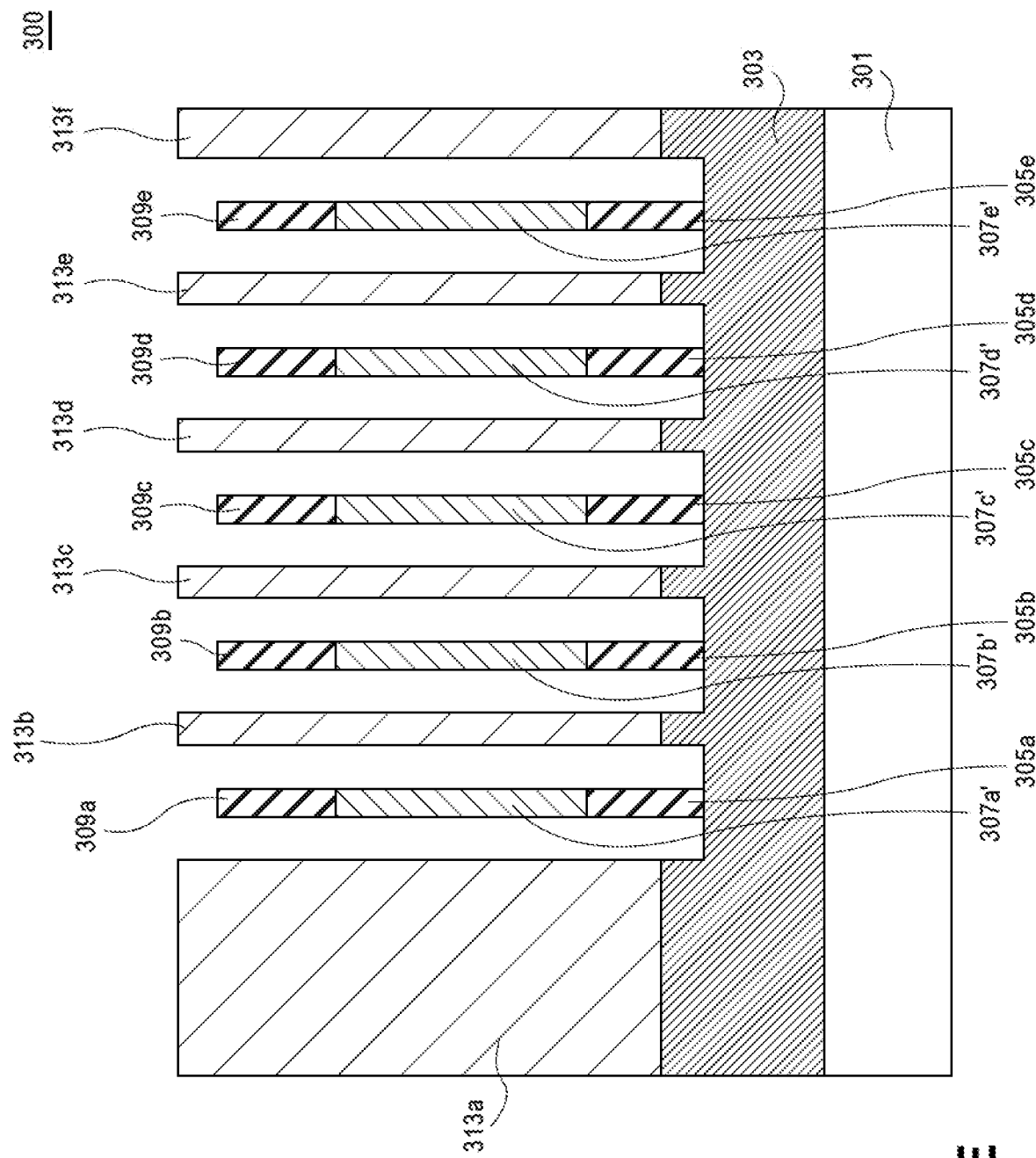

Referring to FIG. 3D, after one or more operations that result in the cross-section of the structure 300 shown in FIG. 3C, the sacrificial or replacement gate material 315a-315e is removed. Referring to FIG. 3E, a cross-sectional cut perpendicular to the fin through the middle of the gate region of the structure 300 as depicted in FIG. 3D is shown. The cross-section of FIG. 3E shows the channel regions 307a'-307e' of central semiconductor regions 307a-307e.

Figure 3F:
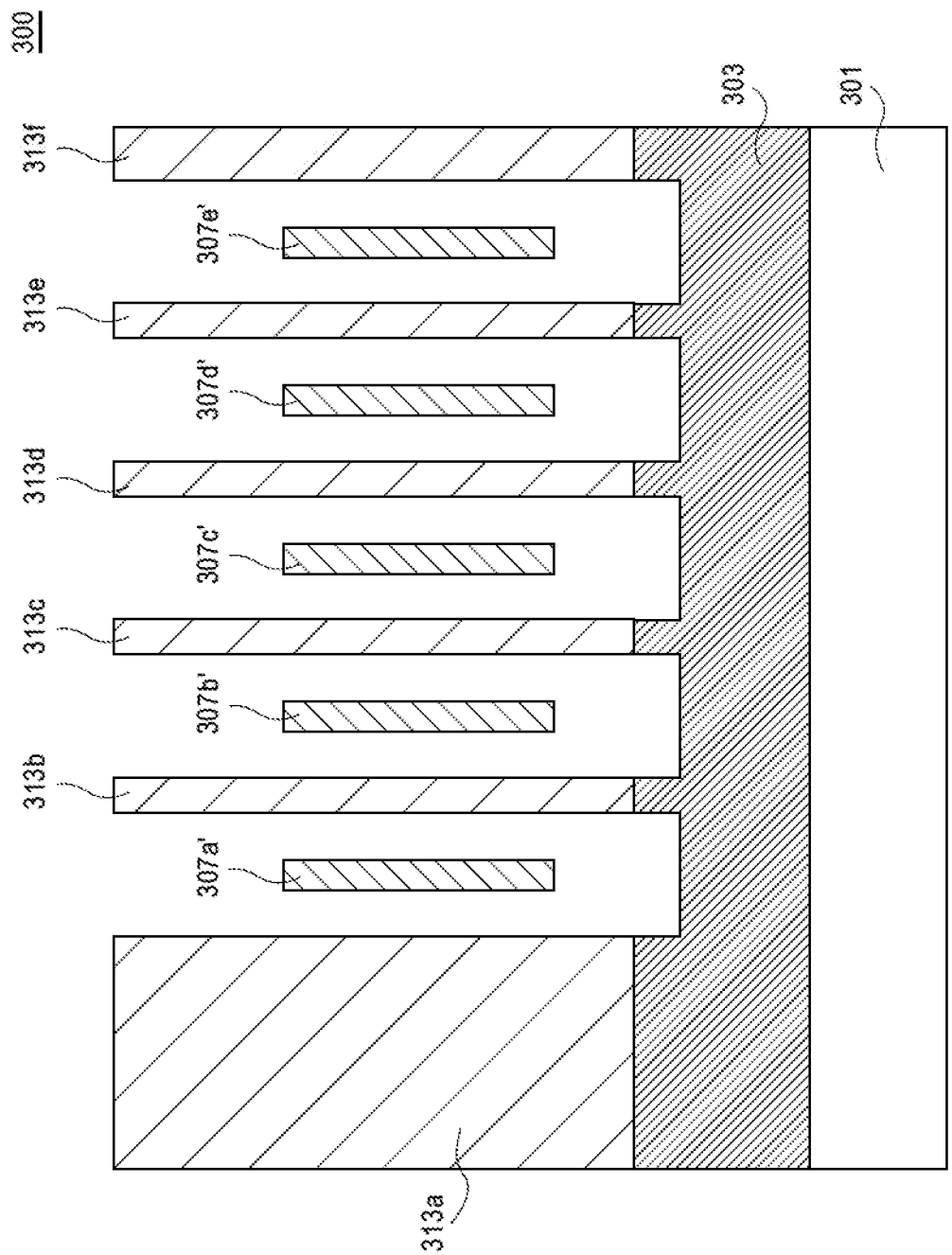

Referring to FIG. 3F, after one or more operations that result in the cross-section of the structure 300 shown in FIG. 3E, the channel regions 307a'-307e' are freed by selective etching. In an embodiment, the channel regions 307a'-307e' are freed by a selective etch of the semiconductor regions 307a-307e relative to semiconductor regions 305a-305e and 309a-309e. In an embodiment, the channel regions 307a'-307e' are freed by a selective etch of SiGe relative to Si. In other embodiments, the channel regions 307a'-307e' can be freed by a selective etch of a semiconductor other than SiGe relative to a semiconductor other than Si. FIG. 3F shows structure 300 after the release of the channel regions 307a'-307e' subsequent to the selective etching of the semiconductors 307a-307e. It should be appreciated that the cross-section of structure 300 shown in FIG. 3F has the same perspective as the cross-section of structure 300 shown in FIG. 3E.

Figure 3G:
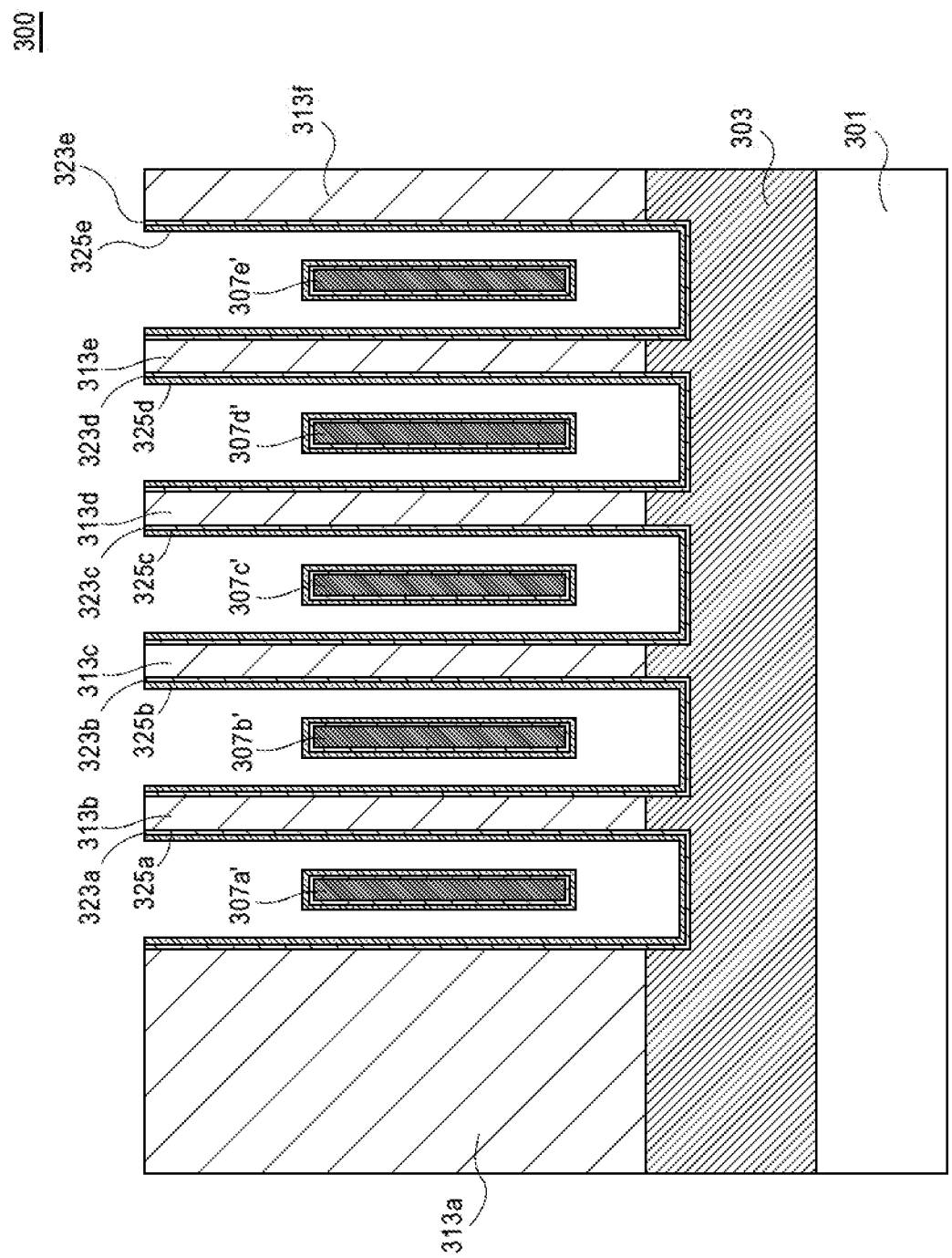
Figure 3H:
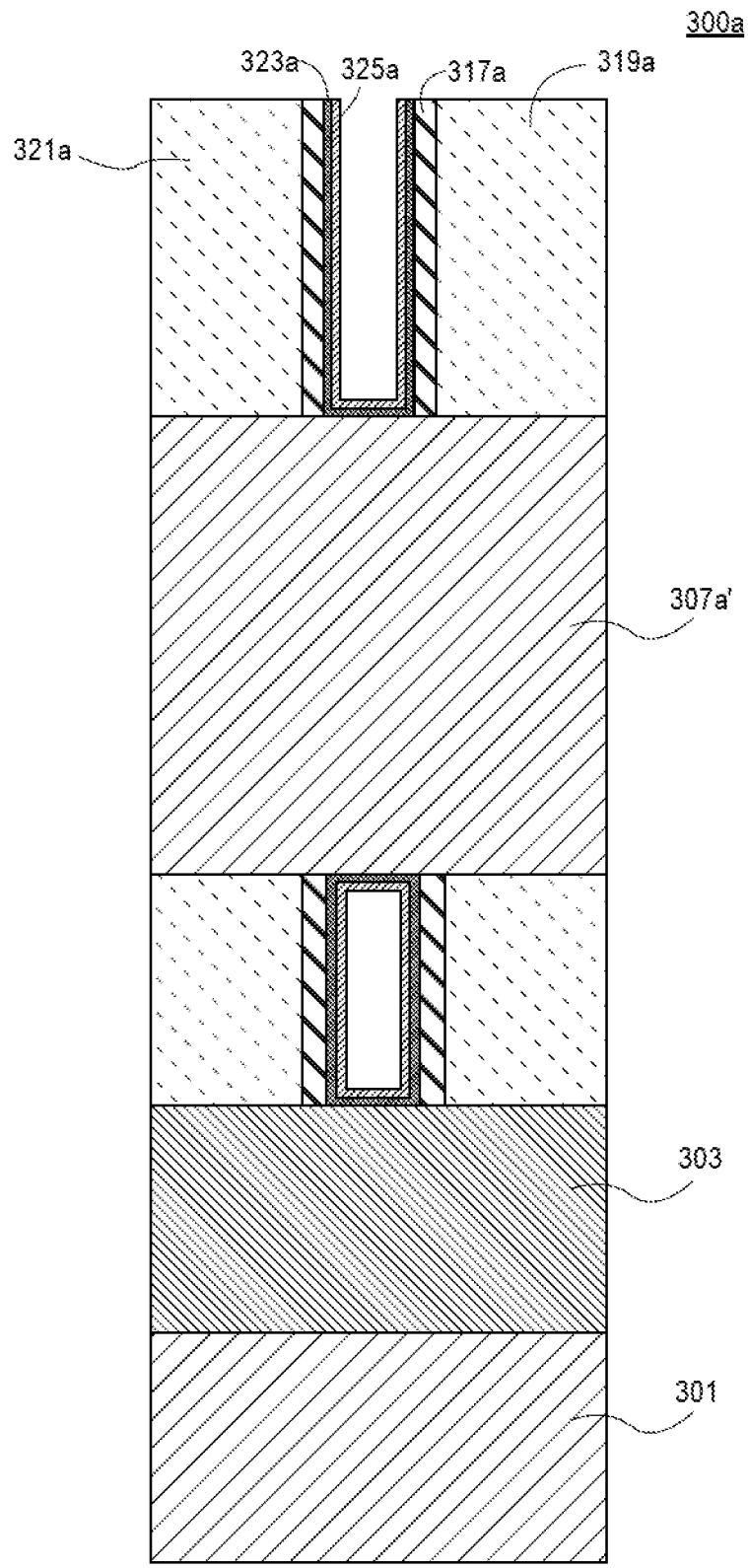

Referring to FIG. 3G, after one or more operations that result in the cross-section of the structure 300 shown in FIG. 3F, a high-k material 323a-323e (or other gate dielectric) and a floating gate material 325a-325e are isotropically formed, on the structure 300, in cavities formed above, below and adjacent the sides of the channel regions 307a'-307e'. More specifically, the high-k material 323a-323e and the floating gate material 325a-325e are layered on the surfaces in the cavities and surround the channel regions 307a'-307e'. In an embodiment, optionally, selective deposition can also be used to form these materials. FIG. 3H shows a cross-section of the leftmost semiconductor structure 300a of the semiconductor structure 300 with high-k material 323a (or other gate dielectric) and floating gate 325a formed as described with reference to FIG. 3G. The FIG. 3G cross-section runs parallel to, and through the center of, the fin that includes the channel region 307a'. In other embodiments, FIG. 3H could show portions of the silicon channel region 307a' removed in the source and drain regions and replaced with epitaxial source and drain material. It should be appreciated that some of the structures shown in FIG. 3H that have been previously described are not described again here for purposes of clarity and brevity.

Figure 3I:
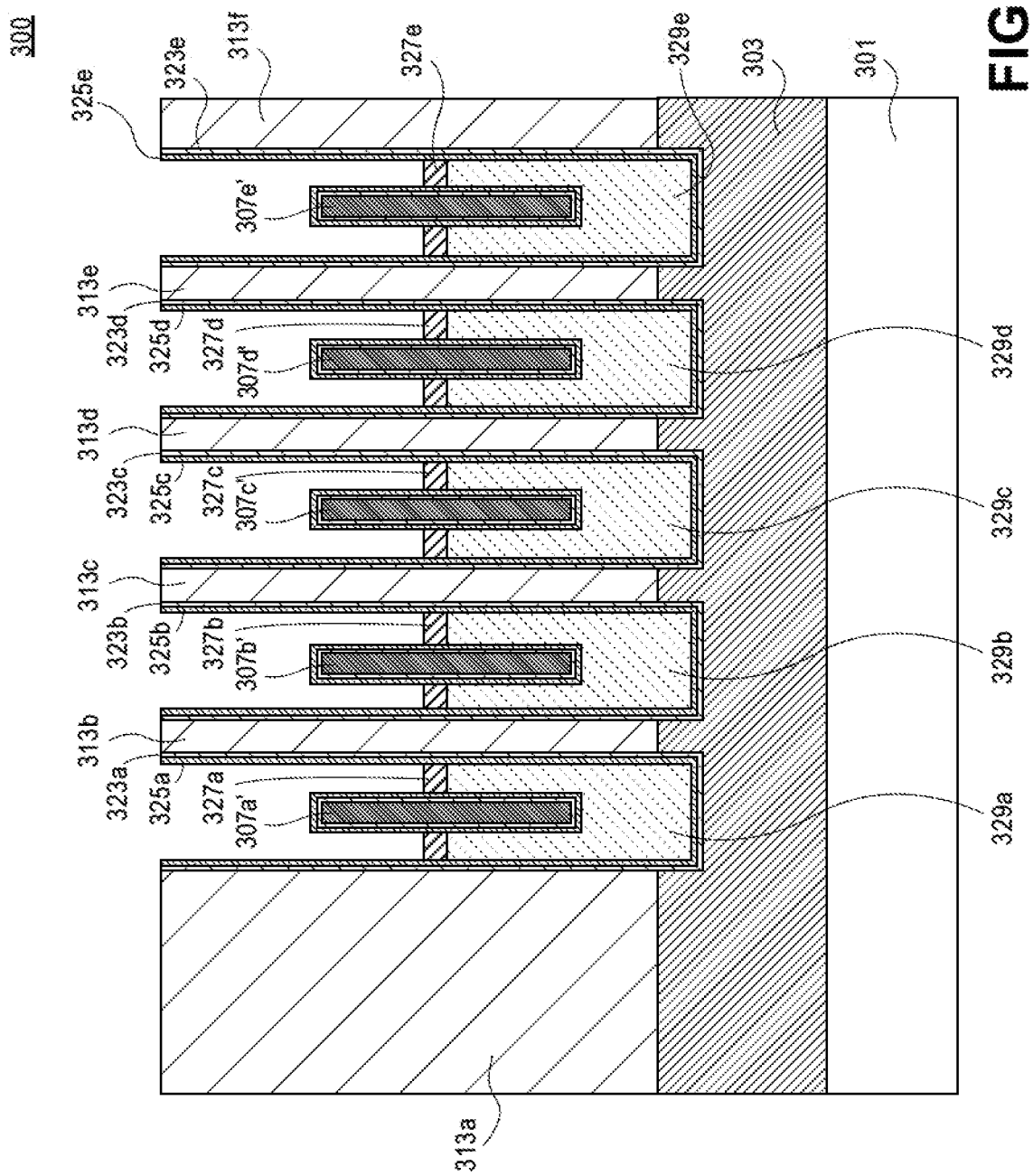

Referring to FIG. 3I, after one or more operations that result in the cross-section of the structure 300 shown in FIG. 3H, the cavity for the top gate is formed. In an embodiment, the cavity for the top gate is formed using a sacrificial material 329a-329e and an insulating material 327a-327e. In an embodiment, the insulating material can be formed from oxide. In other embodiments, the insulating material can be formed from other materials. The sacrificial material 329a-329e and the insulating material 327a-327e are formed in the cavity surrounding the channel regions 307a'-307e' of the semiconductor 307. In an embodiment, these materials are then recessed (to the position of these materials that is shown in FIG. 3I) to form a cavity for top gates. In an embodiment, the floating gates 325a-325e, and the high-k material 323a-323e that is located between the floating gates 325a-325e and the channel regions 307a'-307e', surround the entire periphery of the central semiconductor region (the region of structure 300 that includes the channel regions 307a'-307e'), including in the region that is surrounded by the recessed material that forms the central insulators 327a-327e and the sacrificial gates 329a-329e. In an embodiment, the sacrificial material 329a-329e (sacrificial gates) can be formed from polysilicon material. In other embodiments, the sacrificial gates 329a-329e can be formed from other material.

Figure 3J:
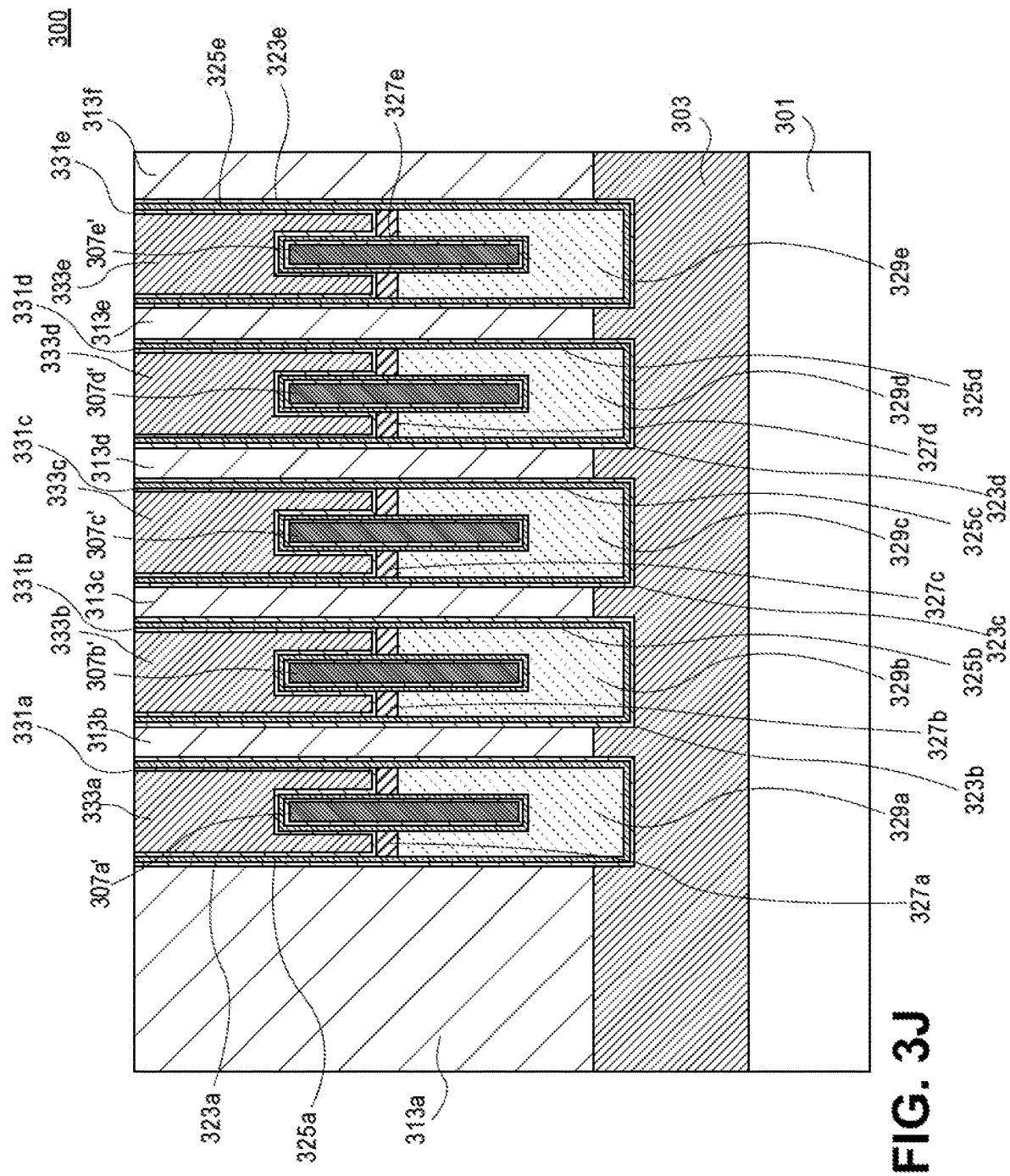

Referring to FIG. 3J, after one or more operations that result in the cross-section of the structure 300 shown in FIG. 3I, a high-k or gate dielectric layer 331a-331e is formed on the surface of the cavities formed to accommodate the top gates and, thereafter, the cavities are filled with a gate metal to complete the formation of the top gates 333a-333e.

Figure 3K:
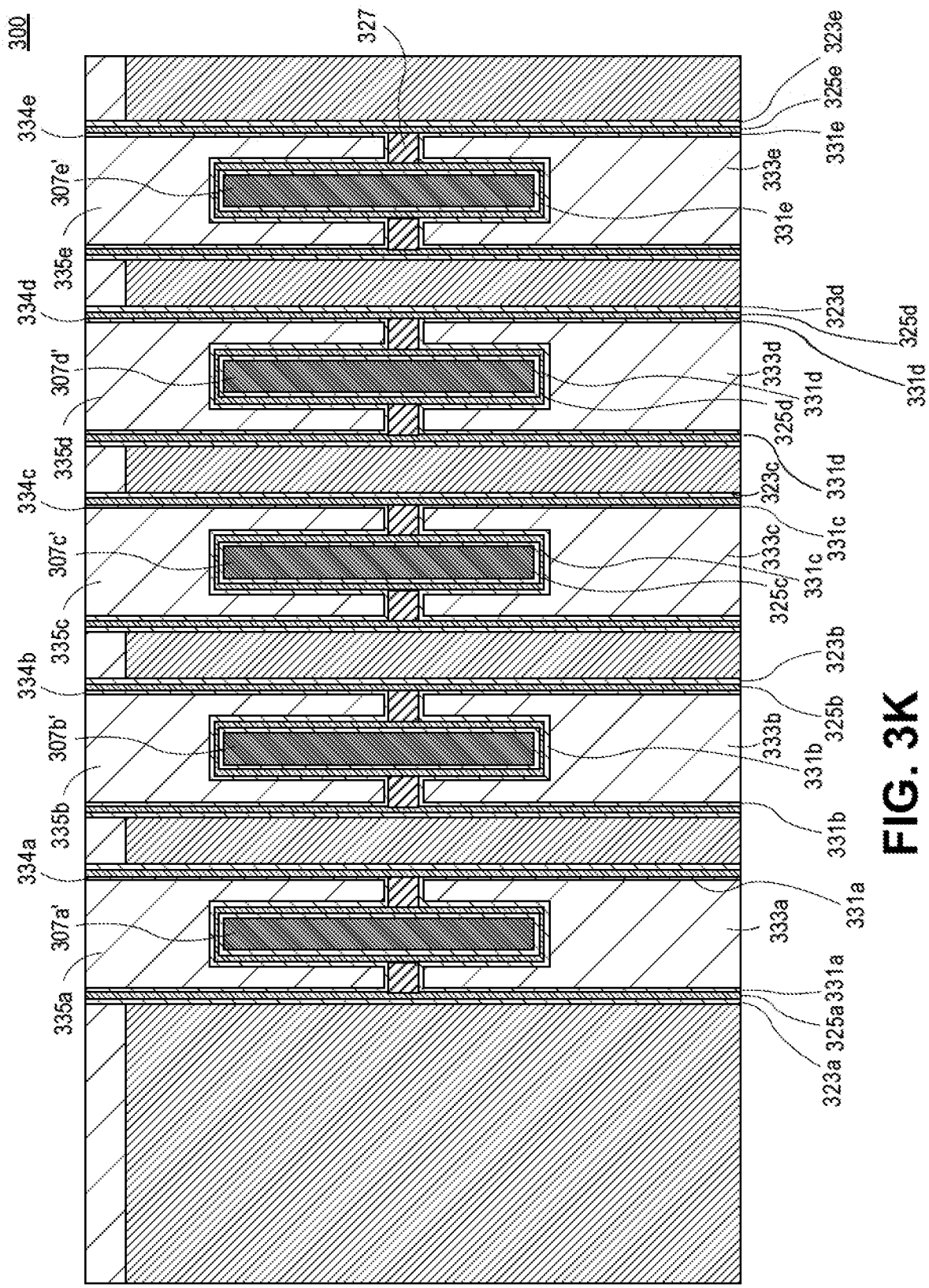

Referring to FIG. 3K, after one or more operations that result in the cross-section of the structure 300 shown in FIG. 3J, the semiconductor structure 300 is inverted and optionally mounted onto a handler. Thereafter, the substrate 301 is removed, through either chemical or mechanical means, and the bottom of the sacrificial material 329a-329e (or sacrificial gate material) exposed. The sacrificial material 329a-329e is then removed. Subsequently, a high-k material (or gate dielectric) 334a-334e and a gate metal fill is formed in the cavities that remain to complete the formation of the bottom gates 335a-335e.

In an embodiment, a critical region of the gate dielectric which surrounds the channel is protected from exposure to etch processes. In an embodiment, this region is continuously protected by the material that is used to form the floating gate. In an embodiment, the process described with reference to FIGS. 3A-3K, can also be used to form 3 or 4 gated semiconductor structures or 2-gated semiconductor structures that include left and right side gates. In particular, such devices can be formed by using a "helmet" layer atop the channel after the floating gate is formed. A helmet layer is a structure that is used to separate two gate structures. In an embodiment, if a helmet is used on one side (top or bottom) of a semiconductor structure (e.g., semiconductor structure 300) a 3-gate structure can be formed. Moreover, if a helmet is used on one side of the semiconductor structure and no gate is formed on the other, a 2-gate left and right gated structure can be formed. Furthermore, if a helmet is used on both the top and the bottom of the semiconductor structure a 4-gate structure can be formed.

Figure 4A:
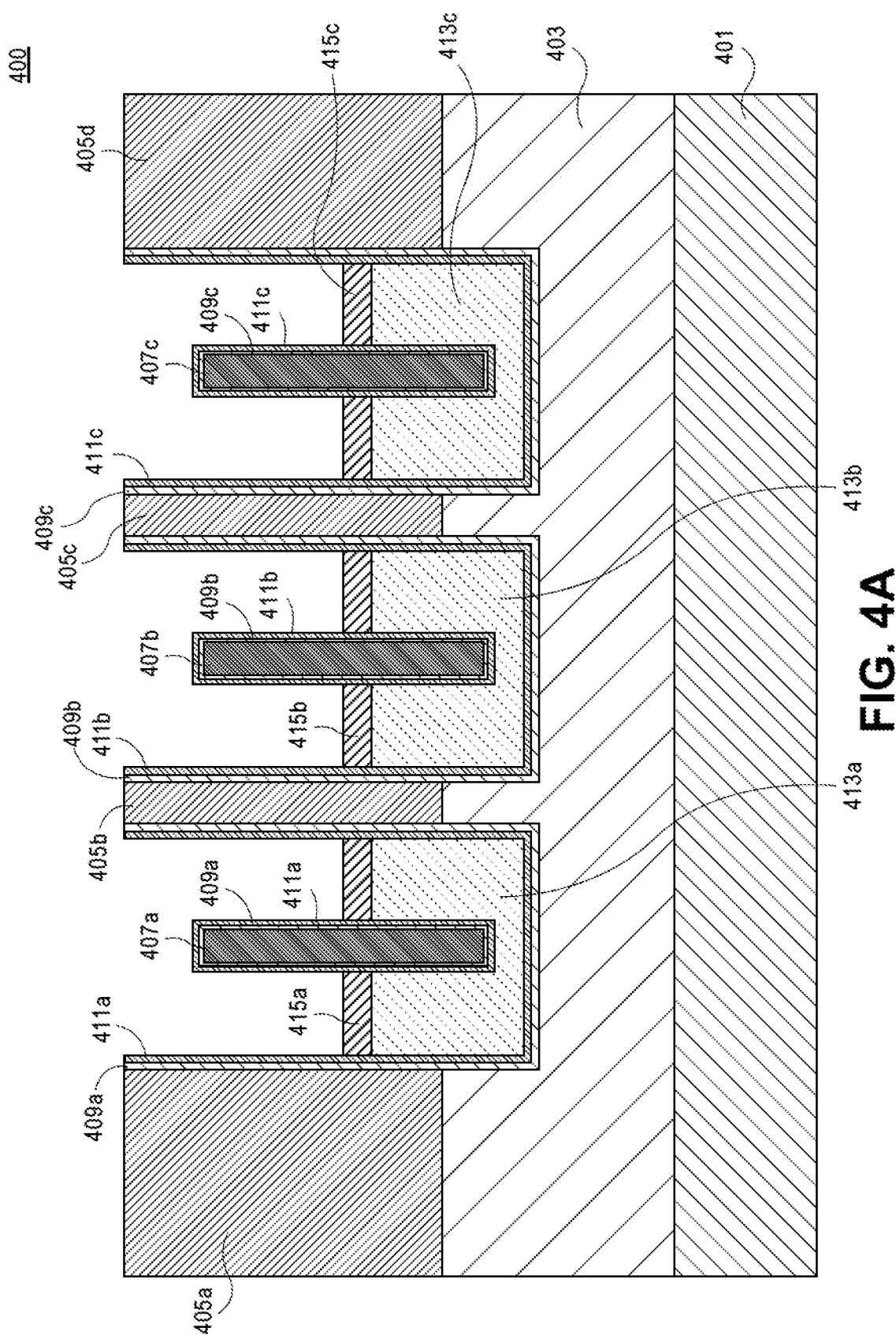
FIG. 4A-4E are illustrations of cross-sections of a semiconductor structure during a process for forming a 3D floating gate multiple input device according to an embodiment.

FIG. 4A-4E are cross-sections of a semiconductor structure 400 during a process for forming a 3D floating gate multiple input device according to an embodiment. In particular, FIGS. 4A-4E are illustrations of a semiconductor structure 400 during a process for forming a 3D floating gate 3 or 4 input device according to an embodiment. FIG. 4A shows a cross-section of the semiconductor structure 400 at a point during the process of forming the 3D floating gate 3 or 4 input device that is similar to the cross-section of the semiconductor structure 300 at the point during the process of forming the 3D floating gate multiple input device shown in FIG. 3I.

Referring to FIG. 4A, subsequent to a plurality of operations the semiconductor structure 400 includes substrate 401, insulator 403, insulator 405a-405d, fins/channel regions 407a-407c, high-k material 409a-409c, floating gates 411a-411c, sacrificial material 413a-413c and insulator 415a-415c. In an embodiment, the semiconductor structure 400 as compared to semiconductor structure 300 includes modifications to enlarge the spacing between the isolation walls (e.g., formed by insulator 405a-405d) and between the fins and isolation walls to allow room for an additional gate contact.

Figure 4B:
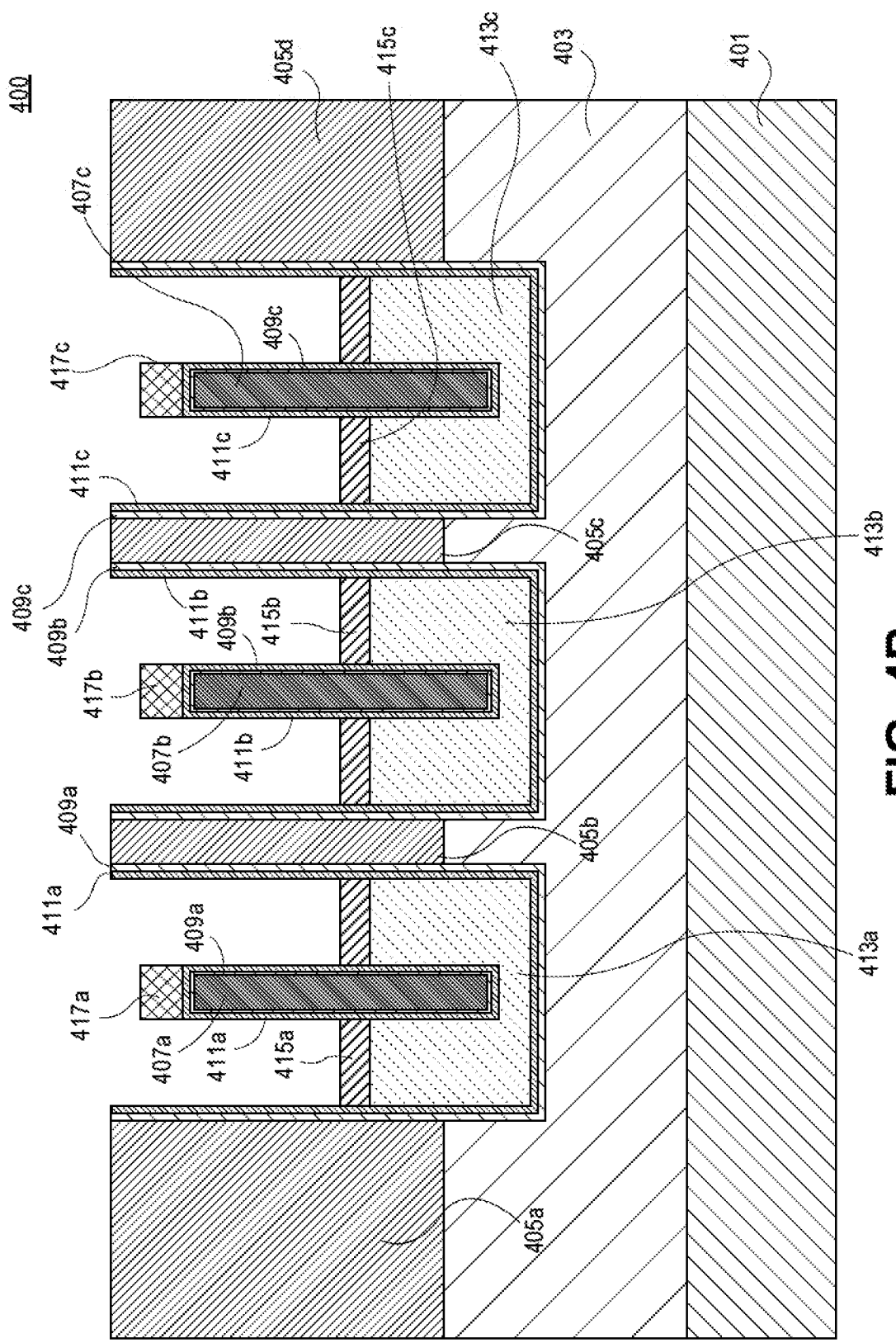

Referring to FIG. 4B, subsequent to one or more operations that result in the cross-section of structure 400 shown in FIG. 4A, helmets 417a-417c are formed atop the fins/channel regions 407a-407c (which already have the first high-k/gate dielectric 409a-409c and the floating gates 411a-411c formed thereon). In an embodiment, the process used in the formation of the helmets atop the fins/channel regions 407a-407c can include depositing a sputtered silicon layer, performing a carbon hardmask (CHM) fill, partially recessing the CHM material, implanting boron into the exposed sputtered silicon region and removing the CHM material. It should be appreciated that in an embodiment, the boron-doped sputtered silicon has etch selectivity to the undoped region. Thereafter, the undoped region is removed leaving the structure shown in FIG. 4B. In other embodiments, other processes and materials can be used to form the helmet.

Figure 4C:
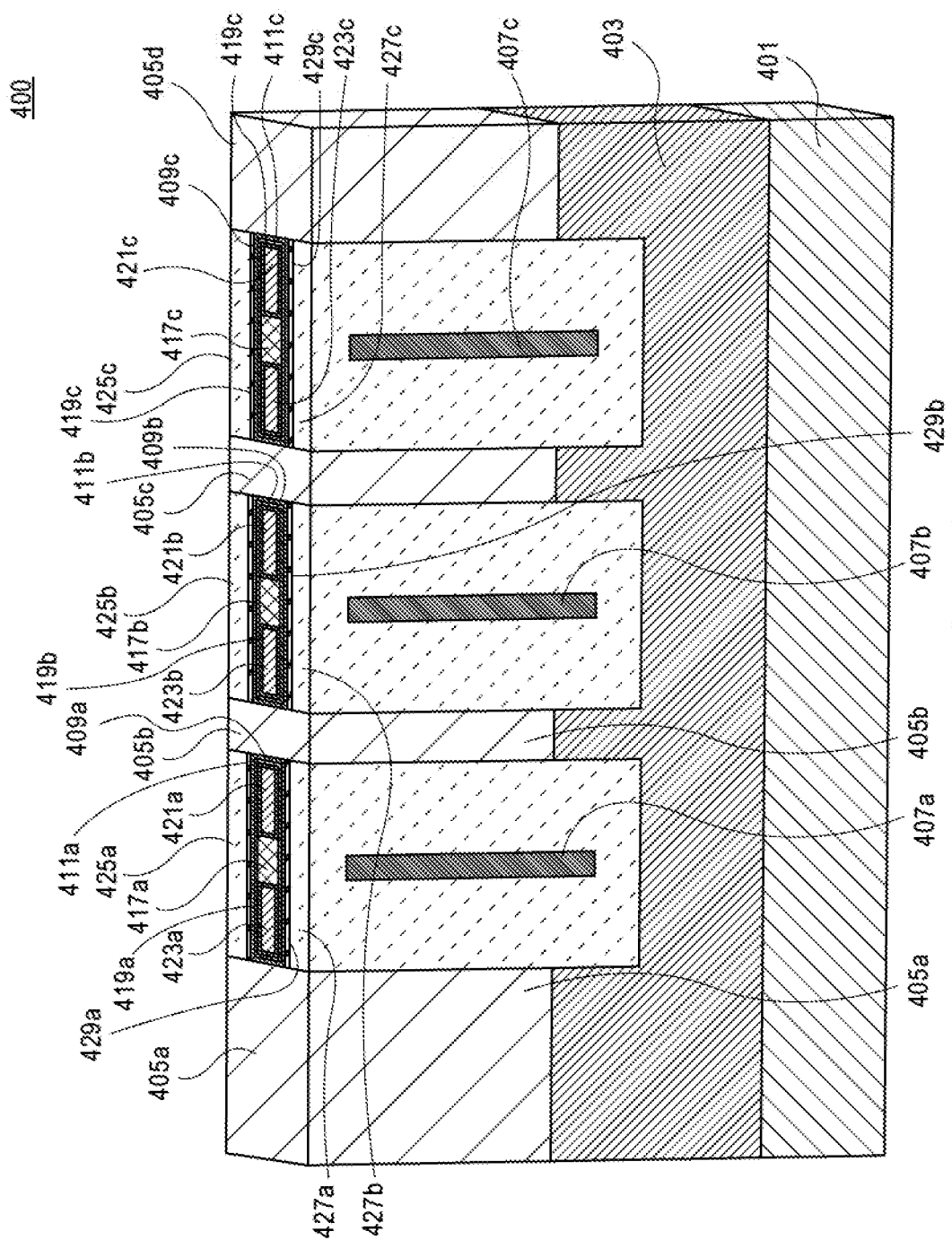

Referring to FIG. 4C, subsequent to one or more operations that result in the cross-section of the semiconductor structure 400 shown in FIG. 4B, spaces on the left and the right of the helmets 417a-417c are filled with high-k material to form dielectric 419a-419c and gate metal to form first gates 421a-421c and second gates 423a-423c. In an embodiment, to form the first gates 421a-421c and the second gates 423a-423c the gate metal is polished to provide 2 top-side gates atop the floating gates 411a-411c on opposite sides of the helmets 417a-417c. FIG. 4C is a perspective view that shows in addition to the aforementioned structures source regions 425a-425c, drain regions 427a-427c regions and spacers 429a-429c.

Figure 4D:
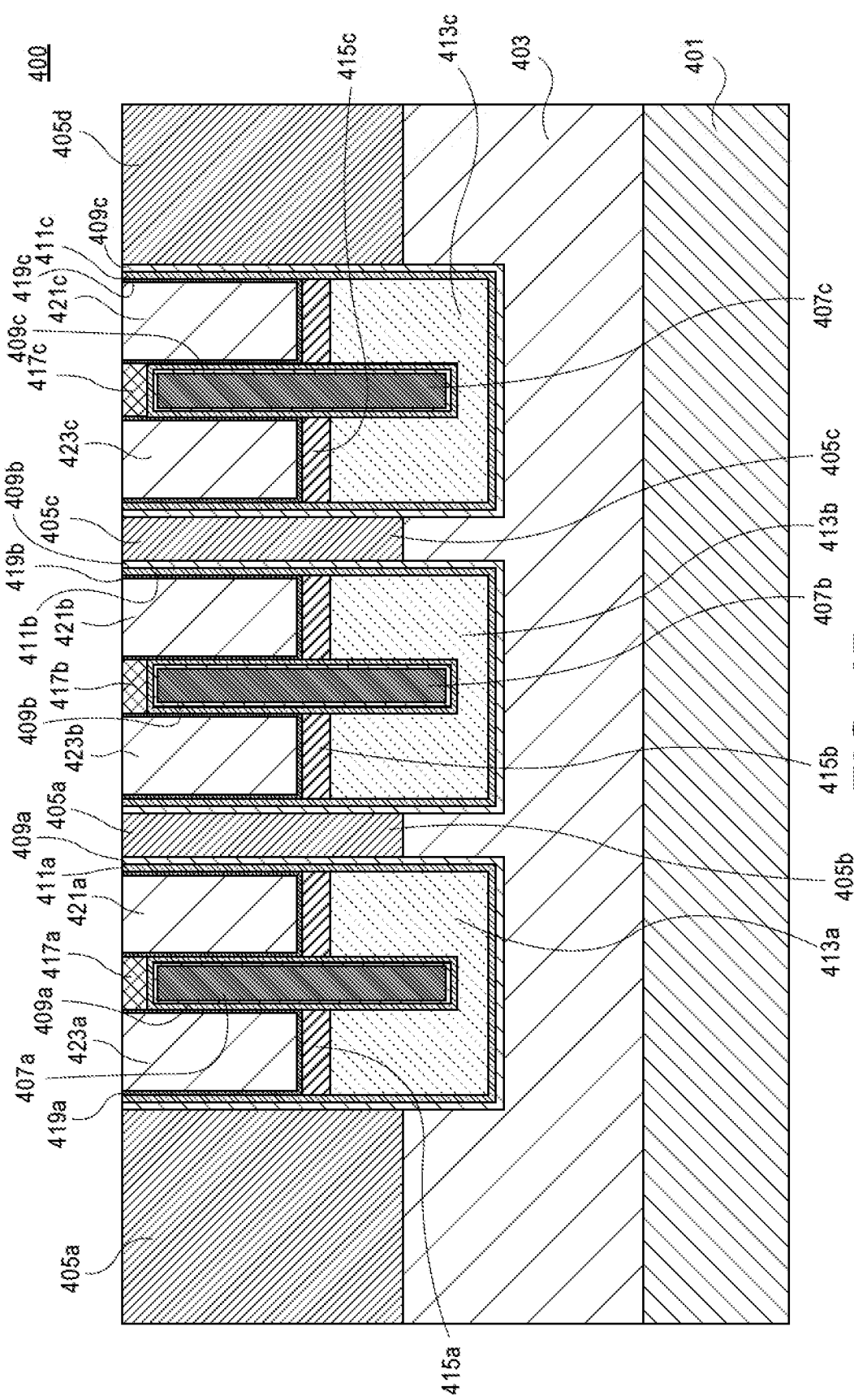

Referring to FIG. 4D, a cross section of the structure 400 depicted in FIG. 4C is shown that illustrates structural features of the first gates 421a-421c and the second gates 423a-423c (e.g., the two top-sided gates for each device). In an embodiment, the material that forms helmets 417a-417c can be readily replaced with insulator materials (optional) based on the application. In an embodiment, bottom-side gate(s) can be formed through the processes described above. In an embodiment, the periphery of the bottom and the top gates may be the same or the periphery of the top or the bottom gates may be longer. The length of the bottom gates and the top gates can be controlled by adjusting the etch depths of the insulator and replacement gate materials previously inserted. In an embodiment, the third gate of a 3-gate device can be formed by repeating the process for forming a gate of a 2-gate device on the bottom side of structure 400. Descriptions of structural features shown in FIG. 4D that were previously described but not described with reference to FIG. 4D are not repeated for purposes of clarity and brevity.

Figure 4E:
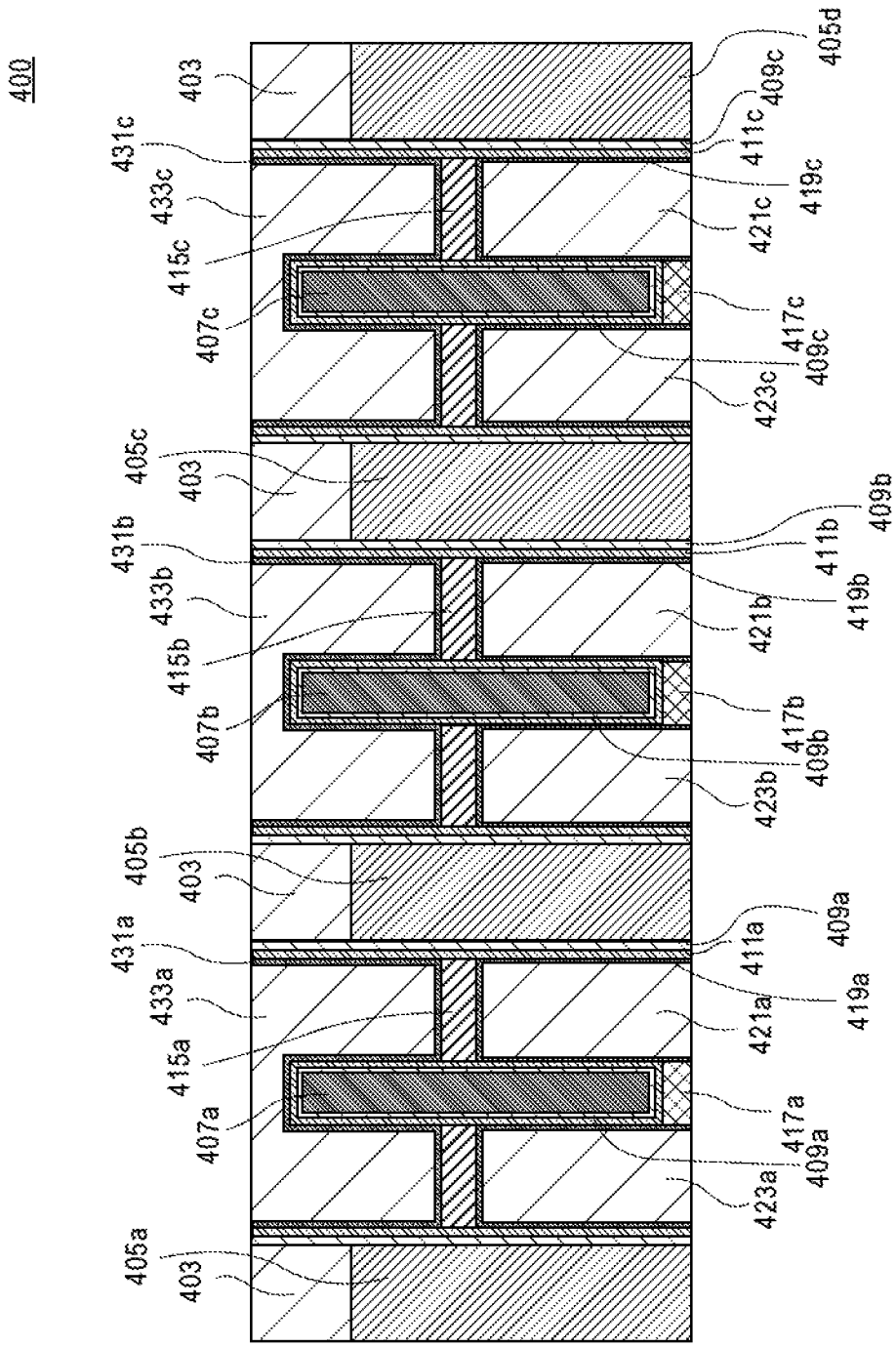

FIG. 4E is an illustration of a 3-gate example of the semiconductor structure 400 described with reference to FIGS. 4A-4D according to an embodiment. Referring to FIG. 4E, after one or more operations that result in the cross-section shown in FIG. 4D, the 3-gate device can be formed by repeating on the bottom side of structure 400 the process described with reference to FIGS. 3A-3K for forming a gate of a 2-gate device. For example, referring again to FIG. 4E, after one or more operations that result in the cross-section shown in FIG. 4D, the structure 400 can be flipped and U-shaped top or first gates 433a-433c formed around the top portions of the channel regions/fins/ribbons 407a-407c on high-k layers 431a-431c. The high-k layers 431a-431c can be formed above the floating gates 411a-411c and the high-k layers 409a-409c that are formed on the tub walls of the gate opening in addition to the central channel regions 407a-407c of the semiconductor structure 400. In this embodiment, the second gate is positioned adjacent a first bottom side (left side in FIG. 4E) of the channel regions/fins 407a-407c and the third gate is positioned adjacent a second bottom side (right side in FIG. 4E) of the channel regions/fins 407a-407c. In an embodiment, the weighting of the input gates is such that the second gate and the third gate are weighted approximately the same, while the first gate can have a greater weight due to its larger periphery. In this manner, the 3D floating gate multiple input device is formed to provide both a majority gate function and weighted sum functionality. A 4-gate structure is a logical extension of the 3 gate structure of FIG. 4E. It should be appreciated that in an embodiment, such a 4-gate device can be formed by repeating the process described with reference to FIGS. 4A-4D on the bottom side of the semiconductor structure 400.

In an embodiment, a long-channel floating gate multiple input (e.g., multiple control gate) implementation that includes a larger control gate count can be provided. In an embodiment, such implementations can feature dissimilar control gate and floating gate lengths and include multiple control gates with multiple control gate pitches within a floating gate pitch. In an embodiment, the process of forming the multiple control gate implementation can be similar to the processes described with reference to FIGS. 4A-4E, but providing a much longer floating gate critical dimension (CD). In an embodiment, these processes can be used to fabricate 3D floating gate multiple input devices with 4, 5, 6, 7, 8 . . . 100 or more control-gate devices that share a single floating gate on a gate all around (GAA) structure. In a GAA structure gate material surrounds the channel region on all sides. In an embodiment, each control gate can contribute to the net charge on the floating gate to produce a "weightedsum" effect.

In an embodiment, the processes described herein can be used to fabricate vertical-channel devices. In an embodiment, fabricating a vertical-channel (vertical transport or conduction direction) device can be straightforward. In particular, fabricating a vertical-channel device does not rely upon timed etches and backside wafer exposure, but involves the formation of a vertical wire (which can be formed using processes used to form certain NAND string devices). This involves a selective metal etch (relative to gate dielectric and floating gate material).

Figure 5C:
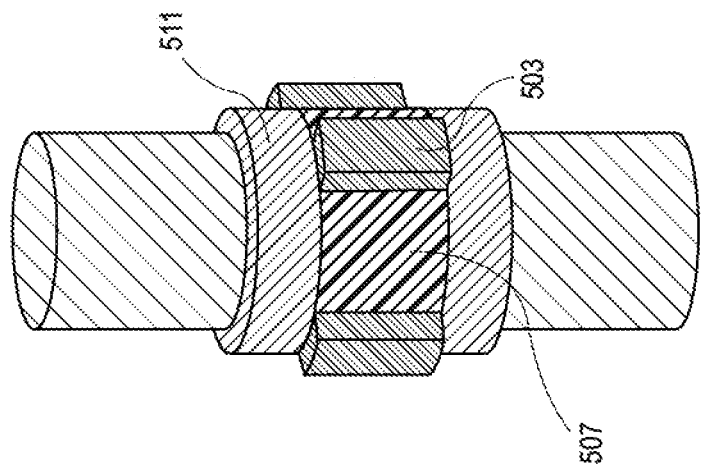
FIGS. 5A-5C are illustrations of two cross-sectional views and a 3D structural view of a 3D floating gate 4-input device of an embodiment.
Figure 5B:
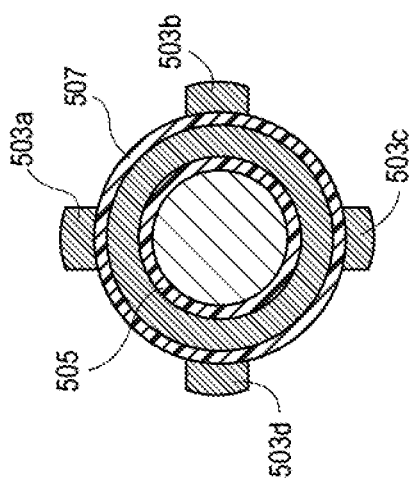
Figure 5A:
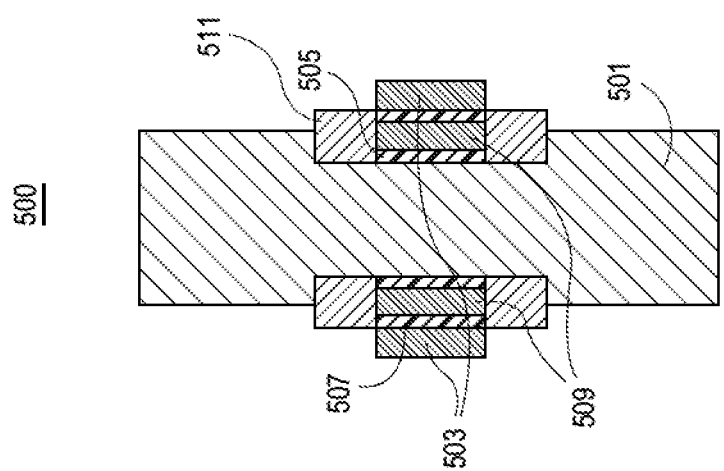

FIGS. 5A-5C are illustrations of two cross-sectional views and a 3D structural view of a 4-input 3D floating gate multiple input device 500 of an embodiment. In the FIGS. 5A-5C embodiments of the 3D floating gate multiple input device 500 includes four control gates, however, any number of control gates can be provided as allowed by lithographic and processing conditions.

In the FIGS. 5A-5C embodiments, the 3D floating gate multiple input device 500 includes source and drain component 501, control gates 503, gate dielectric 505, gate dielectric 507, floating gates 509 and gate spacer 511. FIG. 5A shows a vertical cross-section cut through opposing control gates of 4-input 3D floating gate device 500. FIG. 5B shows a lateral cross-section cut through the middle of the gate structure. FIG. 5C provides a three dimensional perspective view of the structural features of the 3D floating gate device 500. In an embodiment, the device can be fabricated using any semiconductor crystal (Si, SiGe, Ge, TFT film, etc.). In addition, it should be appreciated that in an embodiment, the device may be fabricated with a nanowire or nanoribbon structure. In such embodiments, a wire with a channel radius of approximately 4-10 nm or a nanoribbon structure with thickness of approximately 4-12 nm and a width of approximately 20-50 nm can be used. In other embodiments, other channel radiuses and nanoribbon thicknesses can be used. In an embodiment, a feature of the 3D floating gate device 500 is its 3D structure which is readily detectible.

Figure 6:
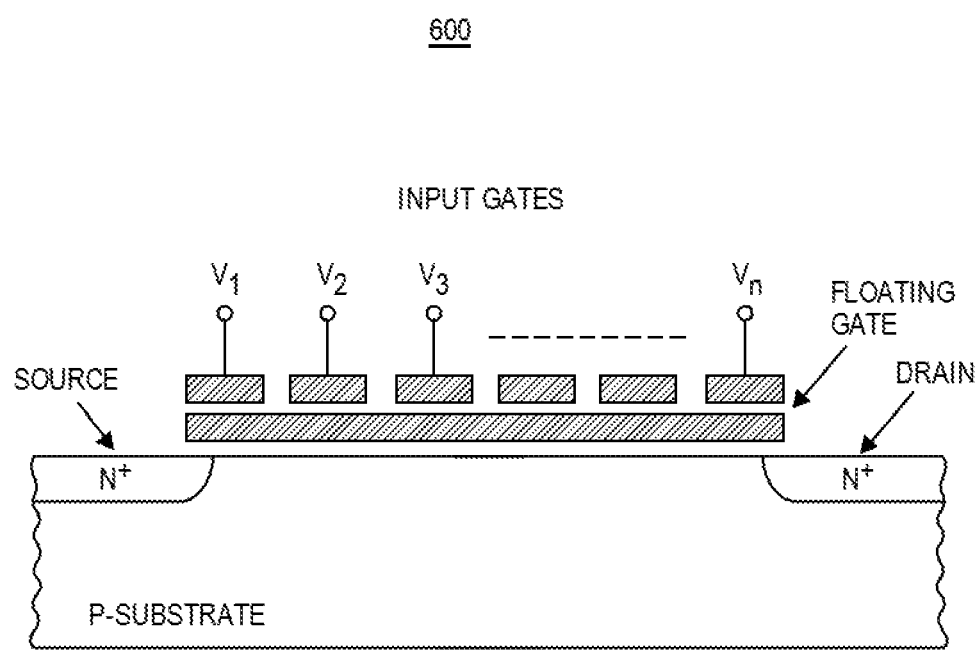
FIG. 6 is an illustration of a planar floating gate multi-input device of a previous approach.

FIG. 6 shows a planar implementation of a multiple input floating gate device 600 of a previous approach. Referring to FIG. 6, the planar multiple input floating gate device 600 includes multiple control gates and a single shared floating gate. In this approach, using modern standards a gate pitch on the order of 50 nm can be used. Consequently, floating gate device 600 (shown having 6 control gates) would require a channel length of approximately 300 nm. The planar architecture of multiple input floating gate device 600 has significant scaling and device electrostatic disadvantages as compared to the multiple input devices of the embodiments described herein with reference to FIGS. 2, 3A-3K, 4A-4E, and 5A-5C due to their planar structure which limits attainable device density and causes electrical interference challenges.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 7:
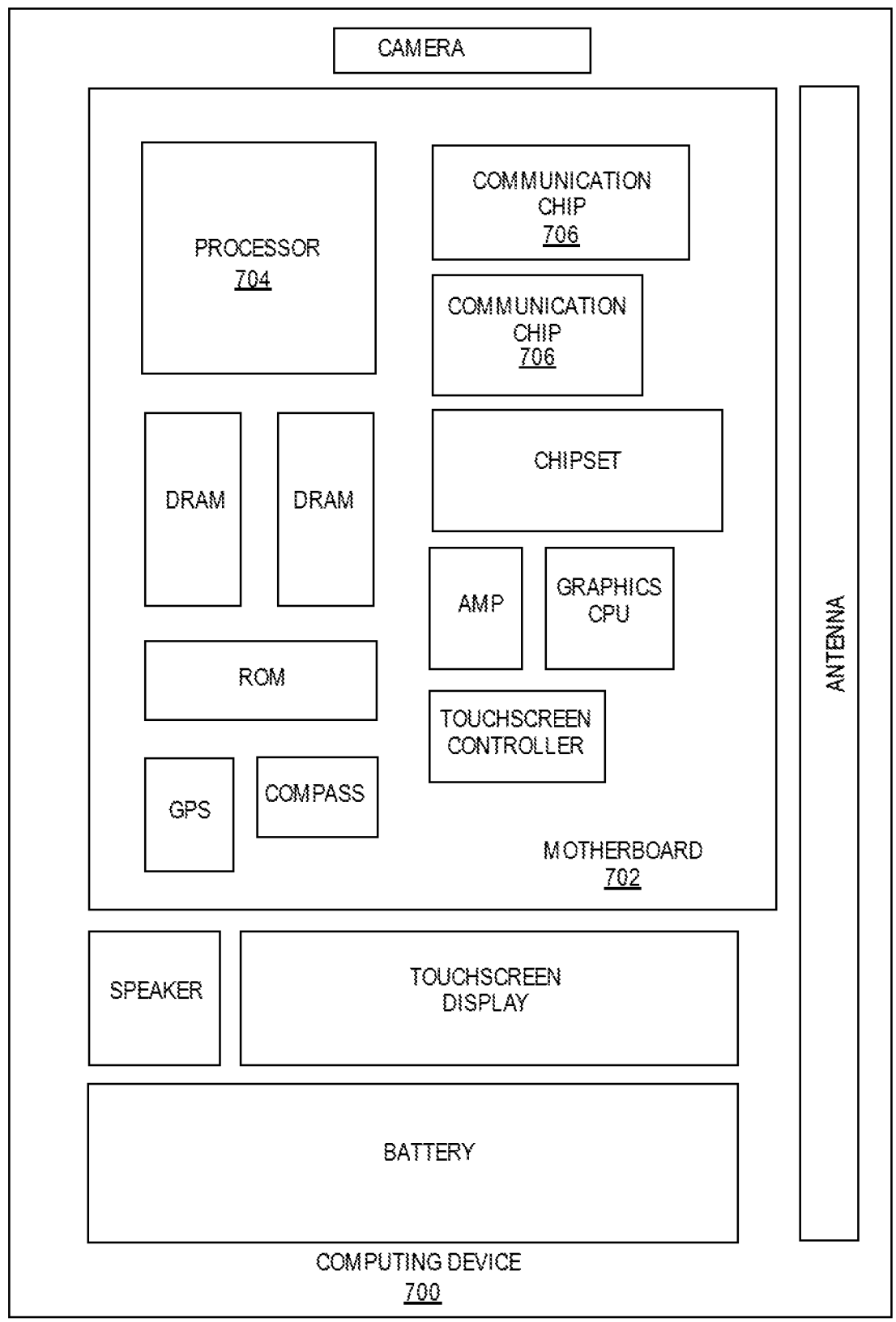
FIG. 7 illustrates an interposer that includes one or more implementations of an embodiment.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip includes one or more devices, such as MOS-FET transistors built in accordance with implementations of the invention.

In further implementations, another component housed within the computing device 700 may contain an integrated circuit die that includes one or more devices, such as MOS-FET transistors built in accordance with implementations of the invention.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
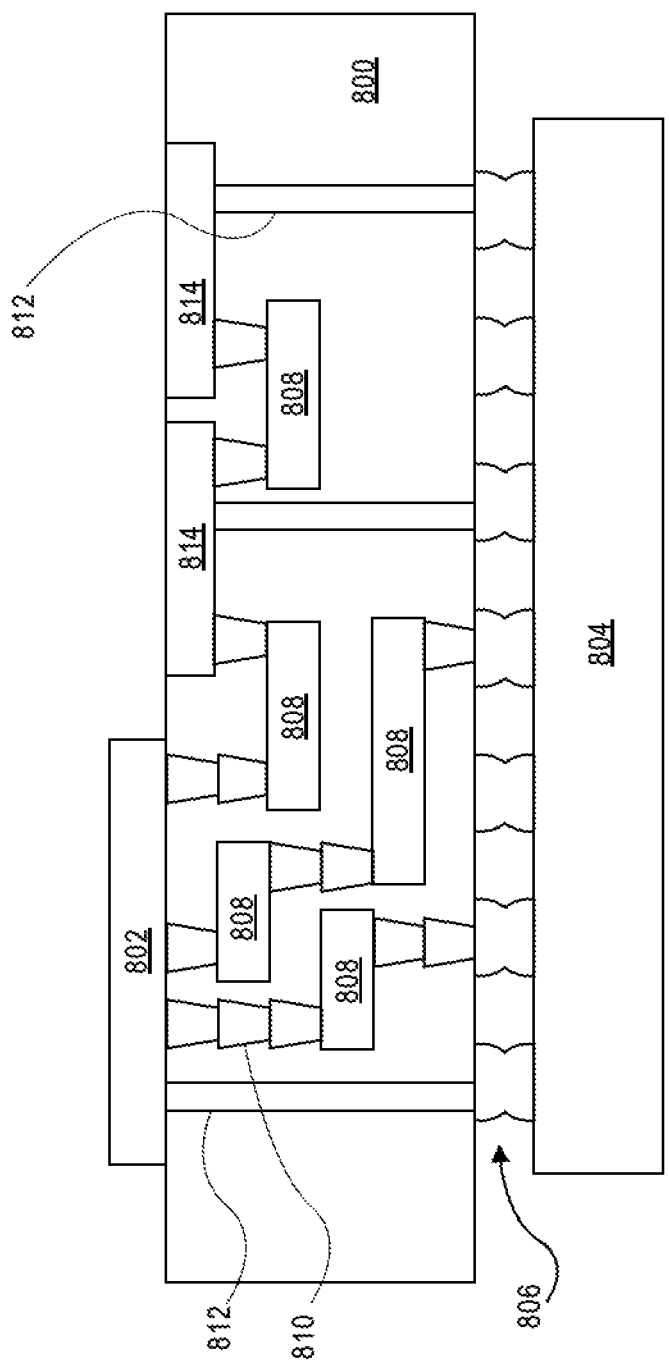
FIG. 8 is a schematic of a computer system according to an embodiment.

FIG. 8 illustrates an interposer 800 that includes one or more embodiments of the invention. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the invention, apparatuses or processes disclosed herein may be used in the fabrication of interposer 800.

Example Embodiment 1

A multiple input device including a semiconductor structure extending in a first direction, a first dielectric material surrounding a portion of the semiconductor structure, a floating gate on the first dielectric material and surrounding the portion of the semiconductor structure, a second dielectric material on the floating gate and surrounding the portion of the semiconductor structure, and a plurality of control gates on the second dielectric material wherein at least one of the control gates extends vertically away from the semiconductor structure in a second direction and at least one of the control gates extends vertically away from the semiconductor structure in a third direction.

Example Embodiment 2

The multiple input device of example embodiment 1, further comprising a source region surrounding a second portion of the semiconductor structure and a drain region surrounding a third portion of the semiconductor structure.

Example Embodiment 3

The multiple input device of example embodiment 1, further comprising a dielectric material that separates control gates that extend in the same direction.

Example Embodiment 4

The multiple input device of example embodiment 1, wherein a first plurality of the control gates extend vertically away from the semiconductor structure in the second direction and a second plurality of the control gates that extend vertically away from the semiconductor structure in the third direction.

Example Embodiment 5

The multiple input device of example embodiment 1, wherein the portion of the semiconductor structure includes a channel of the semiconductor device.

Example Embodiment 6

The multiple input device of example embodiment 1, further comprising a horizontally extending dielectric that separates the one or more control gates that extend vertically in the second direction from one or more control gates that extend vertically in the third direction.

Example Embodiment 7

The multiple input device of example embodiment 1, 2, 3, 4, 5 or 6 wherein the first dielectric material and the second dielectric material are high-k materials.

Example Embodiment 8

A multiple input device including a vertically extending semiconductor structure, a first dielectric material surrounding a portion of the semiconductor structure, a floating gate on the first dielectric material and surrounding the portion of the semiconductor structure, a second dielectric material surrounding the portion of the semiconductor structure and on the floating gate, and a plurality of control gates on the second dielectric material wherein the control gates surround the portion of the semiconductor structure and extend away from the portion of the semiconductor structure in different directions.

Example Embodiment 9

The multiple input device of example embodiment 8, further comprising a source region and a drain region located at opposing ends of the semiconductor structure.

Example Embodiment 10

The multiple input device of example embodiment 8, further comprising a gate spacer between the floating gate, the control gates and the source and drain regions.

Example Embodiment 11

The multiple input device of example embodiment 8, wherein a cross-section of the portion of the semiconductor structure has a circular geometry.

Example Embodiment 12

The multiple input device of example embodiment 8, wherein the portion of the semiconductor structure includes a channel of the multi-gate semiconductor device.

Example Embodiment 13

The multiple input device of example embodiment 8, wherein the first dielectric material, the floating gate and the second dielectric material are concentric.

Example Embodiment 14

The multiple input device of example embodiment 8, 9, 10, 11, 12 or 13 wherein the first dielectric material and the second dielectric material are high-k materials.

Example Embodiment 15

A method including forming a semiconductor structure extending in a first direction, forming a first dielectric material surrounding a portion of the semiconductor structure, forming a floating gate on the first dielectric material and surrounding the portion of the semiconductor structure, forming a second dielectric material on the floating gate and surrounding the portion of the semiconductor structure; and forming a plurality of control gates on the second dielectric material wherein at least one of the control gates is formed to extend vertically away from the semiconductor structure in a second direction and at least one of the control gates is formed to extend vertically away from the semiconductor structure in a third direction.

Example Embodiment 16

The method of example embodiment 15, further comprising forming a source region around a second portion of the semiconductor structure and a drain region around a third portion of the semiconductor structure.

Example Embodiment 17

The method of example embodiment 15, further comprising forming a dielectric material that separates control gates that extend in the same direction.

Example Embodiment 18

The method of example embodiment 15, wherein a first plurality of the control gates extend vertically away from the first semiconductor structure in the second direction and a second plurality of the control gates that extend vertically away from the first semiconductor structure in the third direction.

Example Embodiment 19

The method of example embodiment 15, wherein the portion of the semiconductor structure includes a channel of the semiconductor device.

Example Embodiment 20

The method of example embodiment 15, 16, 17, 18 or 19 further comprising forming a horizontally extending dielectric that separates the one or more control gates that extend vertically in the second direction from the one or more control gates that extend vertically in the third direction.

What is claimed is:

1. A multiple input device, comprising:
   a semiconductor structure extending in a first direction;
   a first dielectric material surrounding a portion of the semiconductor structure;
   a floating gate on the first dielectric material and surrounding the portion of the semiconductor structure;
   a second dielectric material on the floating gate and surrounding the portion of the semiconductor structure; and
   a plurality of control gates on the second dielectric material wherein at least one of the control gates extends vertically away from the semiconductor structure in a second direction and at least one of the control gates extends vertically away from the semiconductor structure in a third direction, wherein the at least one of the control gates that extends vertically away from the semiconductor structure in the second direction vertically overlaps with the at least one of the control gates that extends vertically away from the semiconductor structure in the third direction.

2. The multiple input device of claim 1, further comprising a source region surrounding a second portion of the semiconductor structure and a drain region surrounding a third portion of the semiconductor structure.

3. The multiple input device of claim 1, further comprising a dielectric material that separates control gates that extend in the same direction.

4. The multiple input device of claim 1, wherein a first plurality of the control gates extend vertically away from the semiconductor structure in the second direction and a second plurality of the control gates that extend vertically away from the semiconductor structure in the third direction.

5. The multiple input device of claim 1, wherein the portion of the semiconductor structure includes a channel of the semiconductor device.

6. The multiple input device of claim 1, further comprising a horizontally extending dielectric that separates the one or more control gates that extend vertically in the second direction from one or more control gates that extend vertically in the third direction.

7. The multiple input device of claim 1, wherein the first dielectric material and the second dielectric material are high-k materials.

8. A multiple input device, comprising:
a vertically extending semiconductor structure;
a first dielectric material surrounding a portion of the semiconductor structure;
a floating gate on the first dielectric material and surrounding the portion of the semiconductor structure;
a second dielectric material surrounding the portion of the semiconductor structure and on the floating gate, wherein the first dielectric material, the floating gate and the second dielectric material are concentric; and
a plurality of control gates on the second dielectric material wherein the control gates surround the portion of the semiconductor structure and extend away from the portion of the semiconductor structure in different directions.

9. The multiple input device of claim 8, further comprising a source region and a drain region located at opposing ends of the semiconductor structure.

10. The multiple input device of claim 8, further comprising a gate spacer between the floating gate, the control gates and the source and drain regions.

11. The multiple input device of claim 8, wherein a cross-section of the portion of the semiconductor structure has a circular geometry.

12. The multiple input device of claim 8, wherein the portion of the semiconductor structure includes a channel of the multi-gate semiconductor device.

13. The multiple input device of claim 8, wherein the first dielectric material and the second dielectric material are high-k materials.

14. A method, comprising:
forming a semiconductor structure extending in a first direction;
forming a first dielectric material surrounding a portion of the semiconductor structure;
forming a floating gate on the first dielectric material and surrounding the portion of the semiconductor structure;
forming a second dielectric material on the floating gate and surrounding the portion of the semiconductor structure; and
forming a plurality of control gates on the second dielectric material wherein at least one of the control gates is formed to extend vertically away from the semiconductor structure in a second direction and at least one of the control gates is formed to extend vertically away from the semiconductor structure in a third direction, wherein the at least one of the control gates that extends vertically away from the semiconductor structure in the second direction vertically overlaps with the at least one of the control gates that extends vertically away from the semiconductor structure in the third direction.

15. The method of claim 14, further comprising forming a source region around a second portion of the semiconductor structure and a drain region around a third portion of the semiconductor structure.

16. The method of claim 14, further comprising forming a dielectric material that separates control gates that extend in the same direction.

17. The method of claim 14, wherein a first plurality of the control gates extend vertically away from the first semiconductor structure in the second direction and a second plurality of the control gates that extend vertically away from the first semiconductor structure in the third direction.

18. The method of claim 14, wherein the portion of the semiconductor structure includes a channel of the semiconductor device.

19. The method of claim 14, further comprising forming a horizontally extending dielectric that separates the one or more control gates that extend vertically in the second direction from the one or more control gates that extend vertically in the third direction.

20. A multiple input device, comprising:
a vertically extending semiconductor structure;
a first dielectric material surrounding a portion of the semiconductor structure, wherein a cross-section of the portion of the semiconductor structure has a circular geometry;
a floating gate on the first dielectric material and surrounding the portion of the semiconductor structure;
a second dielectric material surrounding the portion of the semiconductor structure and on the floating gate; and
a plurality of control gates on the second dielectric material wherein the control gates surround the portion of the semiconductor structure and extend away from the portion of the semiconductor structure in different directions.

* * * * *